United States Patent
Shin et al.

(10) Patent No.: US 10,331,266 B2
(45) Date of Patent: Jun. 25, 2019

(54) DISPLAY DEVICE HAVING TOUCH SENSORS AND DRIVING METHOD THEREOF

(71) Applicant: LG DISPLAY CO., LTD., Seoul (KR)

(72) Inventors: Seungrok Shin, Goyang-si (KR); Deuksu Lee, Goyang-si (KR); Sangkyu Kim, Goyang-si (KR); Jaegyun Lee, Paju-si (KR); Taeyun Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 43 days.

(21) Appl. No.: 15/639,439

(22) Filed: Jun. 30, 2017

(65) Prior Publication Data
US 2018/0004345 A1  Jan. 4, 2018

(30) Foreign Application Priority Data

Jun. 30, 2016  (KR) .................. 10-2016-0083077
Sep. 30, 2016  (KR) .................. 10-2016-0126705

(51) Int. Cl.
| | |
|---|---|
| *G06F 3/041* | (2006.01) |
| *G06F 3/044* | (2006.01) |
| *G09G 3/36* | (2006.01) |
| *G09G 3/3266* | (2016.01) |
| *G09G 3/3275* | (2016.01) |
| *G02F 1/1333* | (2006.01) |
| *G02F 1/1362* | (2006.01) |
| *H01L 27/32* | (2006.01) |

(52) U.S. Cl.
CPC ........ *G06F 3/0416* (2013.01); *G02F 1/13338* (2013.01); *G02F 1/136286* (2013.01); *G06F 3/044* (2013.01); *G06F 3/0412* (2013.01); *G09G 3/3266* (2013.01); *G09G 3/3275* (2013.01); *G09G 3/3677* (2013.01); *G09G 3/3688* (2013.01); *H01L 27/323* (2013.01)

(58) Field of Classification Search
CPC ...... G06F 3/0416; G06F 3/0412; G06F 3/044; G06F 2203/04107; G02F 1/13338; G02F 1/136286; G09G 3/3266; G09G 3/3275; G09G 3/3677; G09G 3/3688; H01L 27/323

See application file for complete search history.

(56) References Cited

U.S. PATENT DOCUMENTS

| | | | |
|---|---|---|---|
| 2014/0049508 A1* | 2/2014 | Kim ................. | G06F 3/044 345/174 |
| 2015/0091850 A1* | 4/2015 | Morein ............. | G06F 3/0412 345/174 |
| 2016/0195977 A1* | 7/2016 | Reynolds ......... | G06F 3/0416 345/174 |

* cited by examiner

*Primary Examiner* — Sardis F Azongha
(74) *Attorney, Agent, or Firm* — Birch, Stewart, Kolasch & Birch, LLP

(57) ABSTRACT

A display device can include a display panel touch block groups, each including touch sensors, each touch sensor corresponds to one or more pixels defined by data lines and gate lines; a data driver that generates and supplies a modulated source signal for display data to a data line; a gate driver that generates a modulated scan-on signal for writing the modulated source signal to a pixel and supplies the modulated scan-on signal to the gate lines; and a touch sensor driver that supplies a touch driving signal to touch wires connected to corresponding touch sensors in each of the touch block groups, and selectively senses for touch on a touch block group, except for a restricted touch block group overlapping a gate line that is supplied with the modulated scan-on signal, in which the modulated source signal or the modulated scan-on signal is synchronized with the touch driving signal.

22 Claims, 19 Drawing Sheets

DISPLAY DEVICE HAVING TOUCH SENSORS AND DRIVING METHOD THEREOF

CROSS REFERENCE TO RELATED APPLICATIONS

This application claims the priority benefit of Korean Patent Application Nos. 10-2016-0083077 and 10-2016-0126705 filed in the Republic of Korea on Jun. 30, 2016, and Sep. 30, 2016, respectively, all of these are incorporated herein by reference for all purposes as if fully set forth herein.

BACKGROUND OF THE INVENTION

Field of the Invention

The present invention relates to a display device having touch sensors and a driving method thereof.

Discussion of the Related Art

User interfaces (UI) enable humans (users) to easily control various types of electronic devices as they want. Typical examples of the user interfaces include keypads, keyboards, mice, on-screen displays (OSD), and remote controllers with an infrared communication capability or radio frequency (RF) communication capability. The user interface technology is continuously developing to improve user sensation and ease of operation. Recently, user interfaces have been evolving into touch UI, voice recognition UI, 3D UI, etc.

The touch UI is becoming increasingly indispensable in portable information appliances such as smartphones, and moreover it is being extensively used in laptop computers, computer monitors, home appliances, etc. There has recently been proposed a technology in which touch sensors are embedded in the pixel array of a display panel (hereinafter called "in-cell touch sensor technology"). In the in-cell touch sensor technology, touch sensors can be installed in a display panel without an increase in the thickness of the display panel.

In the in-cell touch sensor technology, electrodes connected to the pixels of the display panel are used as electrodes of the touch sensors. For example, the in-cell touch sensor technology may involve segmenting a common electrode for supplying a common voltage to the pixels of a liquid crystal display and using segmented common electrode patterns as electrodes of the touch sensors.

Since the in-cell touch sensor technology uses segmented common electrode patterns as electrodes of the touch sensors, display noise may be mixed in with a touch sensing signal when the touch sensors are driven while input image data is being written to pixels, which can distort the touch sensing signal.

In order to decrease distortion in the touch sensing signal, in the in-cell touch sensor technology of the related art, one frame period is time-divided into a period (hereinafter, "display interval Td") for driving the pixels based on a touch synchronization signal Tsync and a period (hereinafter, "touch interval Tt") for driving the touch sensors, as shown in FIG. 1. In the in-cell touch sensor technology of the related art, the pixels are driven during the display interval Td, and thus, a common voltage Vcom is applied to the common electrode patterns COM, a data signal Vdata corresponding to input image data is applied to data lines D1 and D2, and a gate signal is applied to gate lines G1 and G2. In the in-cell touch technology of the related art, a touch driving signal Tdrv is applied to the common electrode patterns only during the touch interval Tt and reads changes in the amount of electric charge in the touch sensors, thereby preventing display noise from being mixed in with the touch sensing signal.

However, the in-cell touch sensor technology is difficult to secure enough time for sufficient touch and display intervals Tt and Td within one frame period because of time-division driving. This problem gets more severe as resolution and frame frequency increase. If the touch interval Tt is short, touch sensitivity is low since the time allocated for each touch electrode's sensing is short. If the display interval Td is not sufficient, this leads to lack of data charging time for driving the display, thereby deteriorating the picture quality of display images.

In addition, technologies of integrating touch sensors in a display device include add-on type and on-cell type. In the add-on type, a display device and a touch panel are separately manufactured, and then the touch panel is attached to an upper substrate of the display device. In the on-cell type, elements constituting a touch panel are formed directly on the upper surface of a display device. In the on-cell type, especially with an organic light-emitting diode display (OLED), a protective cap for protecting the OLED display is provided on the top, and touch electrodes for a touch panel are formed on the protective cap.

The add-on type and the on-cell type do not lack sufficient touch and display intervals because the touch interval and the display interval are not temporally separated but overlap. However, in a display device having add-on type or on-cell type touch sensors, signal lines for display and the touch sensors form parasitic capacitance, which can attenuate the touch sensing signal and therefore decrease touch sensitivity.

SUMMARY

The present invention has been made in an effort to provide a display device which improves touch sensitivity and the picture quality of display images by overlapping a touch interval and a display interval, which improves touch sensing signal sensitivity by minimizing the effects of parasitic capacitance formed by signal lines for display and touch sensors, and a driving method thereof.

An exemplary embodiment of the present invention provides a display device having touch sensors, in which the display device includes: a display panel comprising a plurality of touch block groups, each touch block group consisting of a plurality of touch sensors, each touch sensor comprising a plurality of pixels defined by a plurality of data lines and gate lines; a data driver that generates a modulated source signal and applies the same to the data lines; a gate driver that generates a modulated scan-on signal for writing the modulated source signal to the pixels and applies the same to the gate lines; and a touch sensor driver that applies a touch driving signal to touch wires connected to the touch sensors on all the touch block groups and that selectively senses the other touch block groups, except for one touch block group to which the modulated scan-on signal is applied, in which the modulated source signal or the modulated scan-on signal is synchronized with the touch driving signal.

Another exemplary embodiment of the present invention provides a driving method of a display device having touch sensors, the display device comprising a plurality of touch block groups, each touch block group consisting of a plurality of touch sensors, each touch sensor comprising a plurality of pixels defined by a plurality of data lines and gate lines, in which the method includes: generating a modulated source signal and applying the same to the data lines, by a data driver; generating a modulated scan-on signal for writing the modulated source signal to the pixels and applying the same to the gate lines, by a gate driver; and applying a touch driving signal to touch wires connected to the touch sensors on all the touch block groups and selectively sensing the other touch block groups, except for one touch block group to which the modulated scan-on signal is applied, by a touch sensor driver, in which the modulated source signal or the modulated scan-on signal is synchronized with the touch driving signal.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
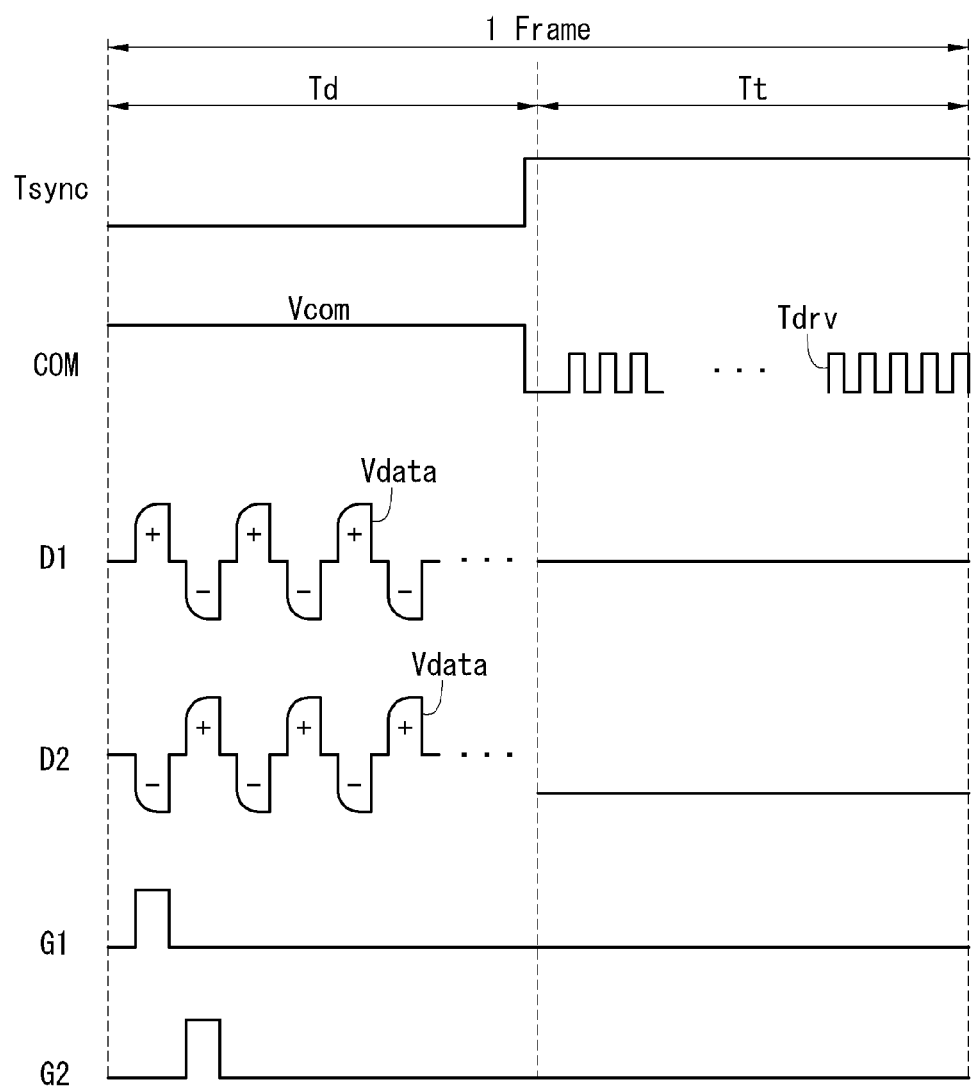
FIG. 1 is a view showing a time-division driving technology of the related art for dividing one frame period into a touch interval and a display interval.

Hereinafter, exemplary embodiments of the present invention will be described in detail with reference to the attached drawings. Throughout the specification, like reference numerals denote substantially like components. In describing the present invention, a detailed description of known functions or configurations related to the present invention will be omitted when it is deemed that they may unnecessarily obscure the subject matter of the present invention.

Figure 2:
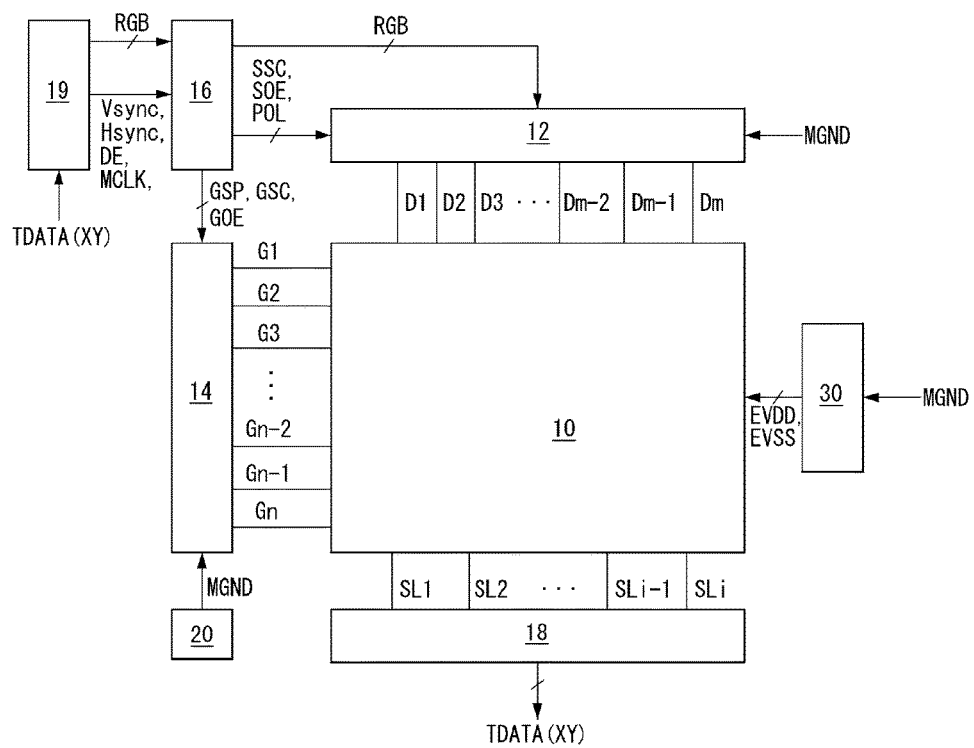
FIG. 2 shows a display device having touch sensors according to an exemplary embodiment of the present invention.
Figure 3:
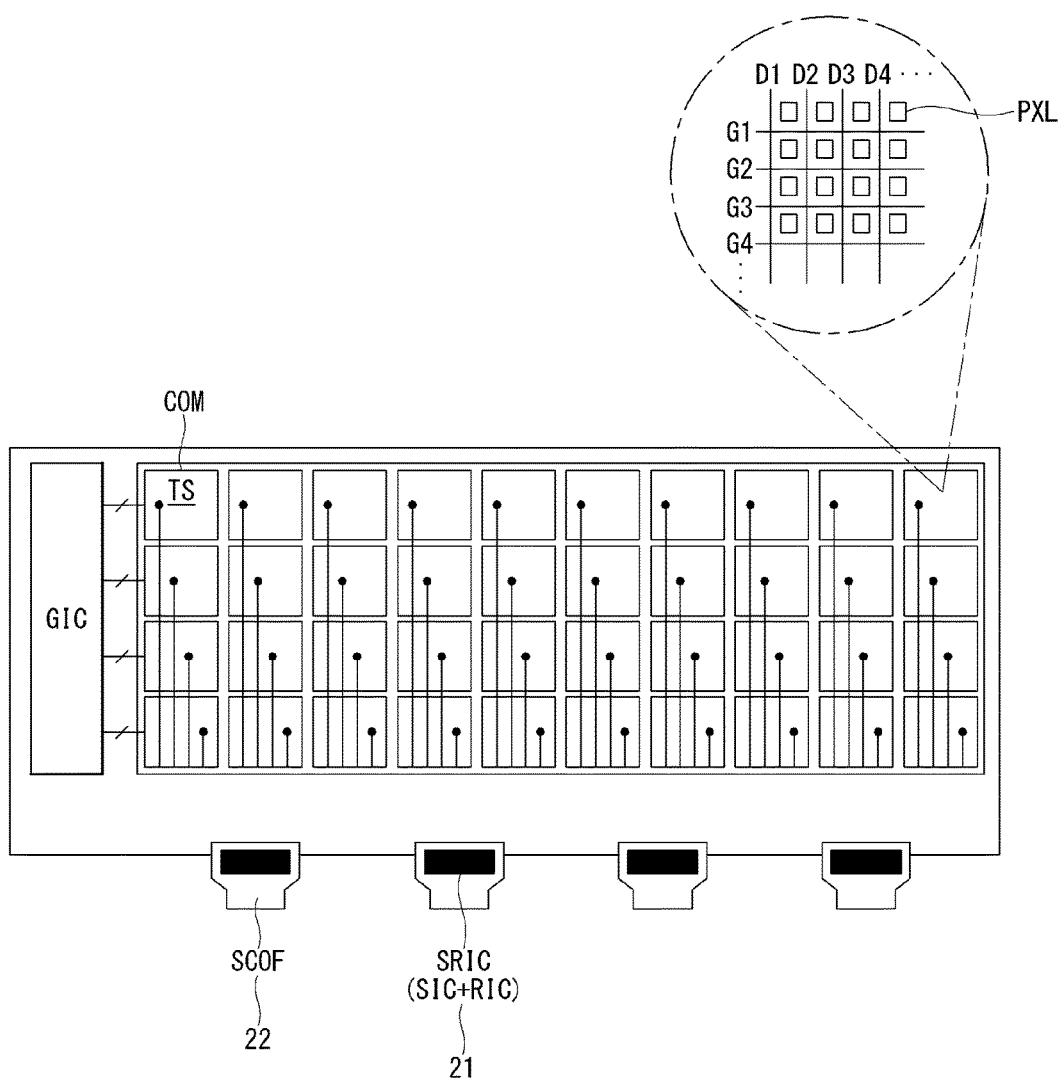
FIG. 3 shows a liquid crystal display with built-in touch sensors according to one exemplary embodiment of the present invention.
Figure 4:
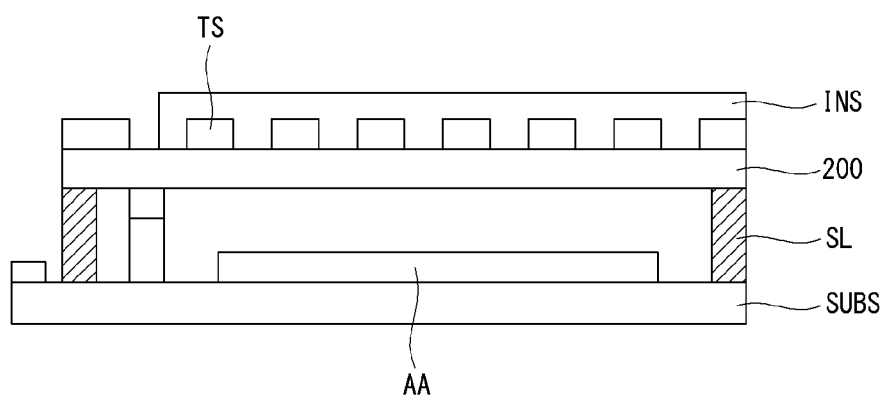
FIGS. 4 to 6 show on-cell type touch sensors integrated with an organic light-emitting display according to another exemplary embodiment of the present invention.
Figure 5:
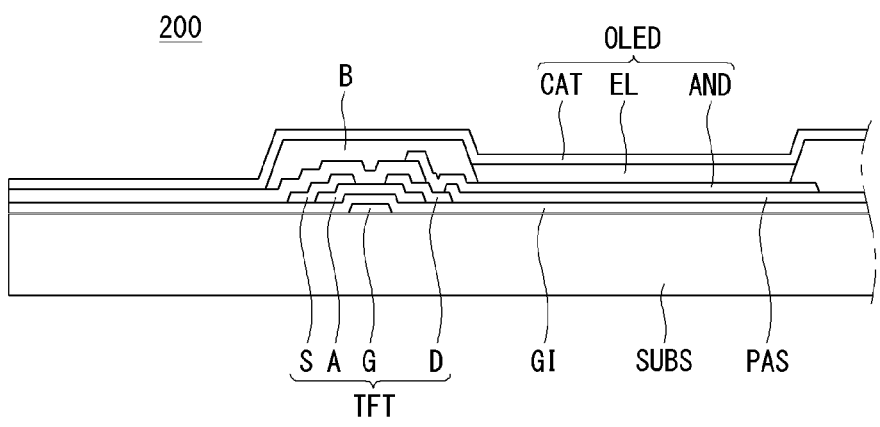
Figure 6:
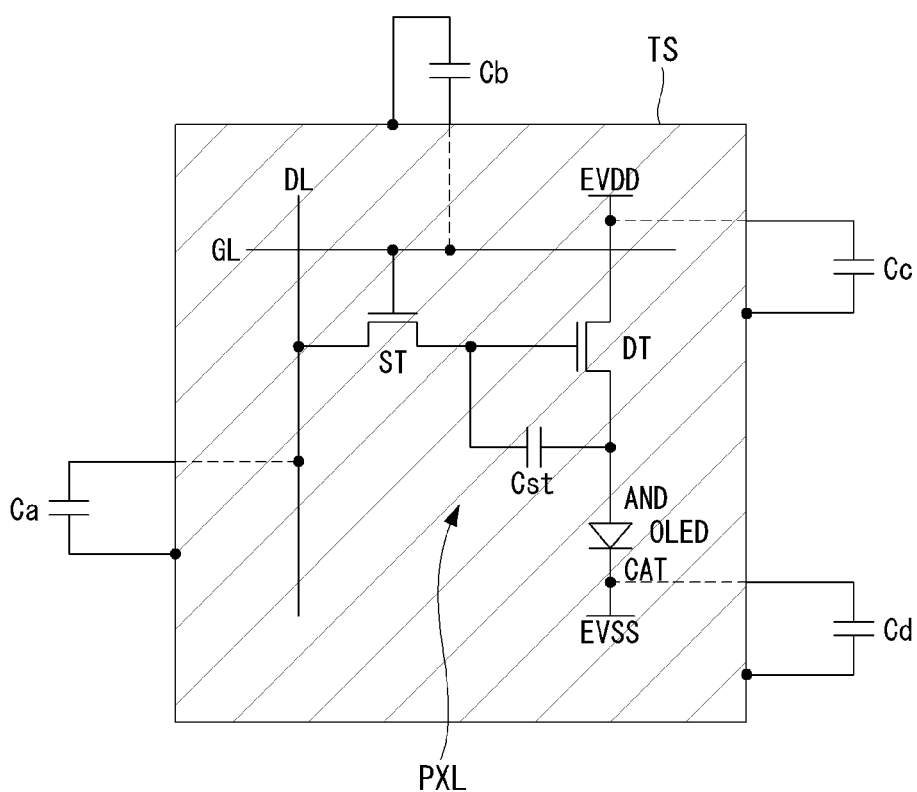
Figure 7:
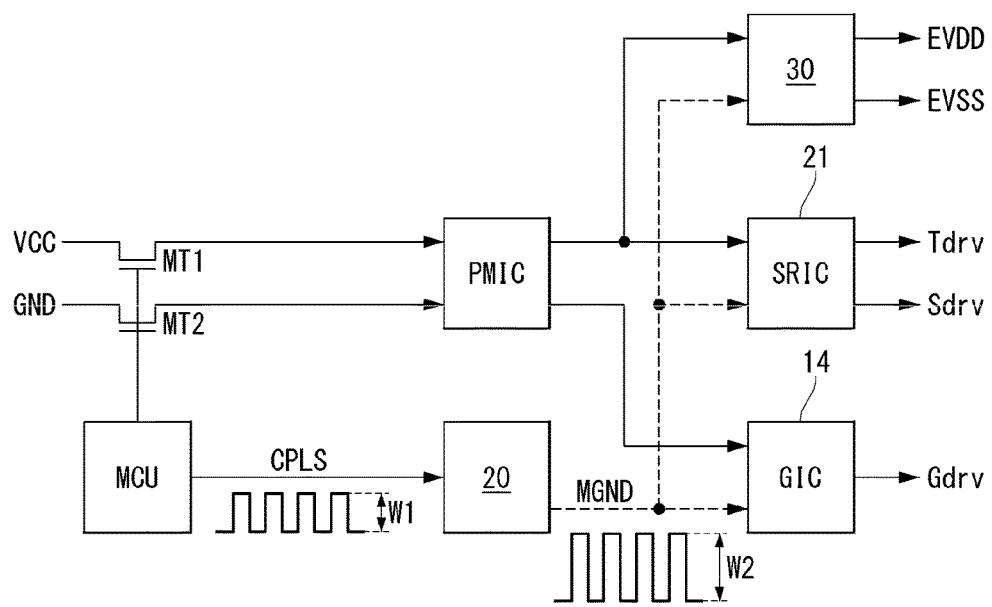
FIG. 7 shows an overall configuration for controlling the supply of a ground signal and a modulated ground signal according to an embodiment of the present invention.

FIG. 2 shows a display device having touch sensors according to an exemplary embodiment of the present invention. FIG. 3 shows a liquid crystal display with built-in touch sensors according to one exemplary embodiment of the present invention. FIGS. 4 to 6 show on-cell type touch sensors integrated with an organic light-emitting display according to another exemplary embodiment of the present invention. FIG. 7 shows an overall configuration for controlling the supply of a ground signal and a modulated ground signal according to an embodiment of the present invention.

Referring to FIGS. 2 to 7, a display device 10 having touch sensors according to an embodiment of the present invention can be implemented based on flat panel displays such as liquid crystal displays LCD, field emission displays FED, plasma display panels PDP, organic light emitting displays OLED, and electrophoresis displays EPD. In the exemplary embodiments below, a display device will be described as being implemented as a liquid crystal display and an organic light-emitting diode display, but the present invention is not limited to them.

A display device having touch sensors according to an embodiment of the present invention can comprise a display panel 10, a data driver 12, a gate driver 14, a timing controller 16, a touch sensor driver 18, a host system 19, a modulated ground signal generator 20, and a driving voltage supply part 30. Here, the modulated ground signal generator 20 can be equipped in the touch sensor driver 18.

The display panel 10 can be implemented as the liquid crystal display panel shown in FIG. 3 or the organic light-emitting display panel shown in FIGS. 4 to 6.

The liquid crystal display panel of FIG. 3 comprises a liquid crystal layer formed between two substrates. A pixel array on the liquid crystal display panel comprises pixels PXL which are formed in pixel regions defined by data lines D1 to Dm (m is a positive integer) and gate lines G1 to Gn (n is a positive integer). Each pixel PXL can comprise TFTs (thin film transistors) formed at the intersections of the data lines D1 to Dm and the gate lines G1 to Gn, a pixel electrode that stores a data voltage, and a storage capacitor Cst connected to the pixel electrode to hold the voltage of a liquid crystal cell.

A common electrode COM of the pixels PXL is divided into a plurality of segments, and touch sensors TS are implemented as common electrode segments COM. One common electrode segment is commonly connected to a plurality of pixels PXL, and forms one touch sensor TS. A plurality of touch sensors placed side by side on one line can form one touch block group (TL1 to TL8 of FIG. 12). Each touch sensor can comprise a plurality of pixels defined by a plurality of gate lines and data lines. Each touch block group (TL1 to TL8 of FIG. 12) overlaps with a plurality of pixel lines, and the width of one touch block group is greater than the width of one pixel line. Here, one pixel line consists of pixels PXL that are placed side by side on one line.

A black matrix, color filters, etc. can be formed on an upper substrate of the liquid crystal display panel. A lower substrate of the liquid crystal display panel can be implemented in a COT (color filter on TFT) structure. In this instance, the black matrix and the color filters can be formed on the lower substrate of the liquid crystal display panel. The common electrode, to which a common voltage is supplied, can be formed on the upper or lower substrate of the liquid crystal display panel. Polarizers are respectively attached to the upper and lower substrates of the liquid crystal display panel, and an alignment film for setting a pre-tilt angle of liquid crystals is formed on an inner surface contacting the liquid crystals. A column spacer is formed between the upper and lower substrates of the liquid crystal display panel to maintain a cell gap for the liquid crystal cell.

A backlight unit can be placed on the back of the liquid crystal display panel. The backlight unit is an edge-type or direct-type backlight unit which illuminates the liquid crystal display panel. The liquid crystal display panel can be implemented in any well-known liquid crystal mode, such as a TN (Twisted Nematic) mode, a VA (Vertical Alignment) mode, an IPS (In-Plane Switching) mode, and an FFS (Fringe Field Switching) mode.

The organic light-emitting display panel of FIG. 4 comprises an array substrate SUBS where an active array AA is formed, touch sensors TS formed on an encapsulation substrate 200 facing the array substrate SUBS, and a sealant SL for bonding the array substrate SUBS and the encapsulation substrate 200 together. A transparent substrate or a metal substrate can be used as the array substrate SUBS. A transparent substrate can be used as the encapsulation substrate 200. A UV curing agent can be used as the sealant SL.

Referring to FIG. 5, a thin-film transistor TFT and an organic light-emitting diode OLED are formed on the array substrate SUBS of the organic light-emitting display. The thin-film transistor TFT comprises a gate electrode G formed on the array substrate SUBS, a gate insulating layer GI covering the gate electrode G, a semiconductor layer A located over the gate insulating layer GI and overlapping the gate electrode G, a source electrode S contacting one side of the semiconductor layer A, and a drain electrode D facing the source electrode S, spaced a certain distance apart from it, and contacting the other side of the semiconductor layer A. A passivation layer PAS is formed over the entire surface of the substrate SUBS where the thin-film transistor TFT is formed. The organic light-emitting diode OLED, connected to the thin-film transistor TFT, is formed over the passivation layer PAS. The organic light-emitting diode OLED comprises an anode AND located over the passivation layer PAS and contacting a drain electrode D via a drain contact hole. Further, a bank B for planarization is formed on the thin-film transistor TFT. An organic emissive layer EL is formed over the anode AND within the pixel region whose surface is almost levelled off due to the bank B. Also, a cathode CAT is formed on the entire surface of the substrate SUBS where the organic emissive layer EL is formed.

Referring to FIG. 6, the active array AA comprises data lines DL, gate lines GL intersecting the data lines DL, and pixels PXL arranged in a matrix to display input image data RGB. Each pixel PXL comprises an OLED, a driving TFT DT, a switching TFT ST, and a capacitor Cst.

A high-level driving voltage EVDD and a low-level driving voltage EVSS are supplied to the pixels PXL. The driving TFT DT is a driving element that controls the amount of current flowing through the OLED according to a gate-source voltage. The switching TFT ST supplies a data voltage from a data line DL to the gate electrode of the driving TFT DT in response to a gate pulse supplied to a gate line GL. The anode AND of the OLED is connected to the source electrode of the driving TFT DT, and the low-level driving voltage EVSS is supplied to the cathode CAT of the OLED. The OLED comprises an organic emissive layer EL. The organic emissive layer EL comprises a hole injection layer HIL, a hole transport layer HTL, an emission layer EML, an electron transport layer ETL, and an electron injection layer EIL. When a driving voltage is applied to the anode AND and cathode CAT of the OLED, a hole supplied through the hole injection layer HIL and the hole transport layer HTL and an electron passing through the electron injection layer EIL and the electron transport layer ETL move to the emission layer EML, forming an exciton. As a result, the emission layer EML generates visible light.

Since the active array AA on the array substrate SUBS of such an organic light-emitting diode display comprises an organic emissive layer, which is susceptible to moisture, there is a need to seal the active array AA off from the outside environment. In one exemplary embodiment, the active array AA can be sealed off from the outside environment by using the encapsulation substrate 200 and the sealant SL. The present invention can offer a touch recognition feature by forming touch sensors TS on one side of the encapsulation substrate 200. In this instance, the touch sensors TS overlap the pixels and signal lines DL and GL within the active array AA, with a plurality of insulating layers in between. By this overlapping structure, a touch sensor TS and a data line DL are connected together via a first parasitic capacitance Ca, the touch sensor TS and a gate line GL are connected together via a second parasitic capacitance Cb, the touch sensor TS and a high-level driving voltage (EVDD) supply line (first driving voltage supply line) are connected together via a third parasitic capacitance Cc, and the touch sensor TS and a low-level driving voltage (EVSS) supply line (second driving voltage supply line) are connected together via a fourth parasitic capacitance Cd. Although a touch sensing signal can be attenuated by the parasitic capacitances Ca, Cb, Cc, and Cd, this problem can be solved by a driving method according to an embodiment of the present invention shown in FIGS. 20 and 21 which will be described later.

The data driver 12 and the gate driver 14 write input image data RGB to the pixels PXL on the display panel 10 under control of the timing controller 16.

The data driver 12 comprises a plurality of source driver ICs (Integrated Circuits) SIC. The data driver 12 converts digital image data RGB fed from the timing controller 16 to an analog gamma compensation voltage according to a data timing control signal to generate a data voltage (source signal), and modulates the data voltage according to a modulated ground signal MGND to output a modulated source signal Sdrv. The modulated source signal Sdrv output from the data driver 12 is supplied to the data lines D1 to Dm. In other words, the modulated ground signal MGND can be used as a type of carrier wave (or alternating voltage bias) on which the image data voltage signals can ride on, which can also be synchronized with modulated gate signals and modulated touch signals.

The data driver 12 generates a modulated source signal Sdrv with the same phase and amplitude as a touch driving signal Tdrv applied to the touch sensors TS, based on the modulated ground signal MGND, and applies the modulated source signal Sdrv to the data lines D1 to Dm to minimize parasitic capacitance between the touch sensors TS and the data lines D1 to Dm and reduce the effects of parasitic capacitance on the touch sensors TS. This is because the voltages at both ends of parasitic capacitance change simultaneously and the amount of electric charge stored in the parasitic capacitance becomes smaller as the voltage difference decreases. When the parasitic capacitance between the touch sensors TS and the data lines D1 to Dm is minimized, this minimizes display noise mixed in with a touch sensing signal and prevents distortion of the touch sensing signal.

The gate driver 14 generates a gate pulse synchronized with a data voltage, with reference to a scan timing control signal fed from the timing controller 16. The gate pulse comprises a scan-on gate signal of gate high-voltage level and a scan-off gate signal of gate low-voltage level. The gate driver 14 modulates the gate pulse according to a modulated ground signal MGND to output a modulated scan-on signal and a modulated scan-off signal to the gate lines G1 to Gn, and selects one display line on the display panel 10 to write a modulated source signal Sdrv to pixels. The modulated scan-on signal is for writing the modulated source signal Sdrv to the pixels, and the modulated scan-off signal is for keeping the modulated source signal Sdrv from being written to the pixels. In other words, the modulated ground signals can be used as a carrier wave for the gate signals.

The gate driver 14 generates a modulated gate signal Gdrv with the same phase and amplitude as a touch driving signal Tdrv applied to the touch sensors TS, based on the modulated ground signal MGND, and applies the modulated gate signal Gdrv to the gate lines G1 to Gn to minimize parasitic capacitance between the touch sensors TS and the gate lines G1 to Gn and reduce the effects of parasitic capacitance on the touch sensors TS. When the parasitic capacitance between the touch sensors TS and the gate lines G1 to Gn is minimized, this minimizes display noise mixed in with a touch sensing signal and prevents distortion of the touch sensing signal.

The gate driver 14 can be configured as a gate driver IC (Integrated Circuit), or formed directly on a lower glass substrate of the display panel 10 by GIP (Gate driver In Panel) technology. The exemplary embodiment of the present invention will be described with an example in which the gate driver 14 is implemented as a GIP element GIC.

The timing controller 16 receives timing signals, such as a vertical synchronization signal Vsync, a horizontal synchronization signal Hsync, a data enable signal DE, and a main clock MCLK from a host system 19, and synchronizes the operation timings of the data driver 12 and gate driver 14. Scan timing control signals comprise a gate start pulse GSP, a gate shift clock, a gate output enable signal GOE, etc. Data timing control signals comprise a source sampling clock SSC, a polarity control signal POL, a source output enable signal SOE, etc.

The touch sensor driver 18 comprises a readout IC RIC, etc., and drives the touch sensors TS integrated with the display panel 10 to perform sensing. The touch sensors TS can be implemented as capacitive sensors for sensing touch input. Capacitance can be classified into self-capacitance and mutual capacitance. Self-capacitance can be formed along a single layer of conductive wires that is formed in one direction, and mutual capacitance may be formed between two intersecting conductive wires.

The readout IC RIC drives all touch sensors TS while the image data is written in the same frame period, and selectively senses the touch sensors TS on the other touch block groups, except for the one touch block group that corresponds to pixels for which image data is being written. That is, the readout IC RIC applies a touch driving signal to touch block groups connected to touch sensors on all touch block groups, and selectively senses the other touch block groups except one touch block group to which a modulated scan-on signal is applied (e.g., sensing touch from all the touch block groups except for the one touch block group that corresponds to pixels that are receiving a gate pulse). In this way, the readout IC RIC does not temporally separate display writing and touch sensing within the same frame, but spatially separates display writing and touch sensing within the display panel 10. In other words, the display writes display image data and senses touch at the same time, but at different locations. For example, during a period within a frame, touch sensing is performed on one portion of the display while at the same time display image data is being written to another portion of the display (e.g., sense touch signals from a lower left region of the display while display data is being written to an upper right region of the display). This solves the lack of sufficient touch and display intervals and also the problem of attenuation of a touch sensing signal due to parasitic capacitance near the touch sensors. The readout IC RIC and the source driver IC SIC can be implemented as a source & readout IC SRIC 21 on one chip. The source & readout IC SRIC 21 may be mounted on a source COF (Chip On Film) SCOF 22.

The host system 19 transmits timing signals Vsync, Hsync, DE, and MCLK, along with digital image data RGB, to the timing controller 16, and can execute an application program associated with touch coordinate information TDATA(XY) fed from the touch sensor driver 18. The host system 19 refers to the system body of an electronic device to which a display device of this invention is applicable. The host system 19 can be implemented as any one of the following: a phone system, a television system, a set-top box, a navigation system, a DVD player, a Blue-ray player, a personal computer PC, and a home theater system. The host system 19 receives touch input data TDATA(XY) from a touch sensing IC TIC and executes an application associated with the touch input.

The driving voltage supply part 30 generates a high-level driving voltage EVDD and a low-level driving voltage EVSS with the same phase and amplitude as a touch driving signal Tdrv applied to the touch sensors TS, based on the modulated ground signal MGND. The driving voltage supply part 30 applies the high-level driving voltage EVDD to the first driving voltage supply line to minimize parasitic capacitance between the touch sensors TS and the first driving voltage supply line and reduce the effects of parasitic capacitance on the touch sensors TS. When the parasitic capacitance between the touch sensors TS and the first driving voltage supply line is minimized, this minimizes display noise mixed in with a touch sensing signal and prevents distortion of the touch sensing signal.

Likewise, the driving voltage supply part 30 applies the low-level driving voltage EVSS to the second driving voltage supply line to minimize parasitic capacitance between the touch sensors TS and the second driving voltage supply line and reduce the effects of parasitic capacitance on the touch sensors TS. When the parasitic capacitance between the touch sensors TS and the second driving voltage supply line is minimized, this minimizes display noise mixed in with a touch sensing signal and prevents distortion of the touch sensing signal.

The modulated ground signal generator 20 generates a modulated ground signal MGND that is applied to the data driver 12, gate driver 14, and driving voltage supply part 30. The modulated ground signal generator 20 operates in conjunction with a power supply part PMIC and a control part MCU, as shown in FIG. 7.

The power supply part PMIC is connected to a high-voltage power source VCC through a first switch MT1 and to a ground power source GND through a second switch MT2, and applies high-voltage power VCC and ground power GND to the data driver 12, gate driver 14, touch sensor driver 18, and driving voltage supply part 30.

Figure 14:
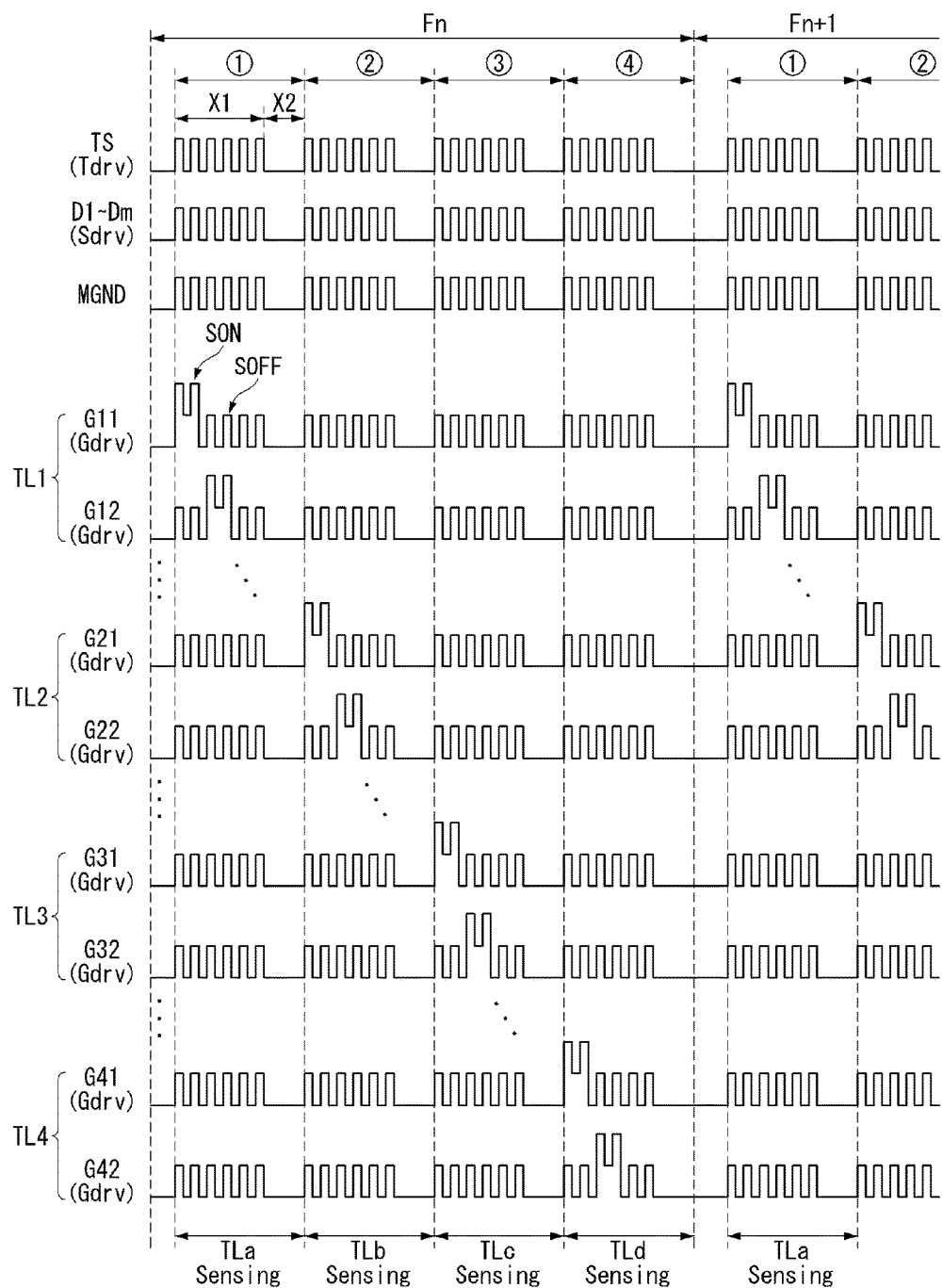
FIG. 14 is a view showing an example of driving signals for driving a display device according to an embodiment of the present invention.
Figure 17:
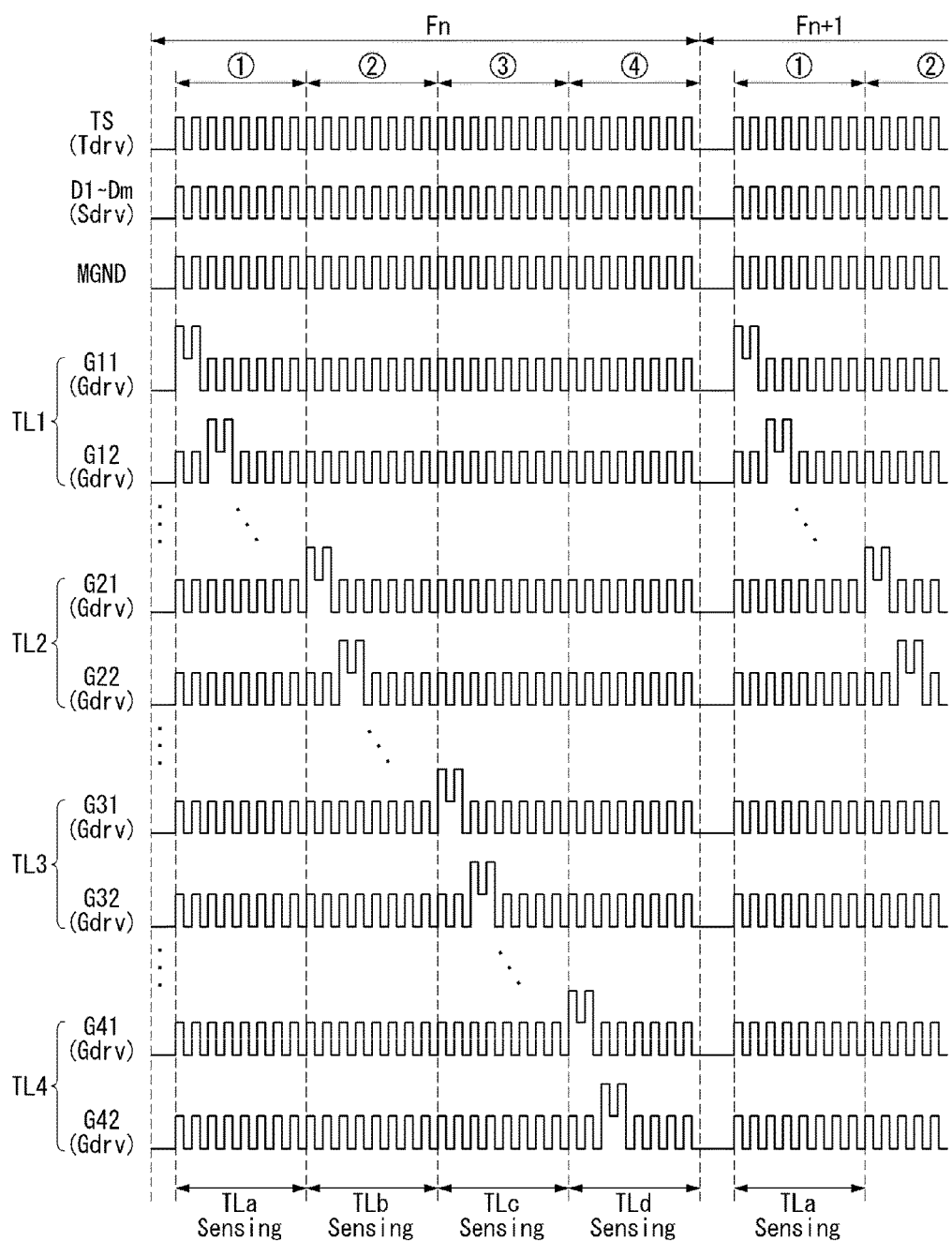
FIG. 17 is a view showing another example of driving signals for driving a display device according to an embodiment of the present invention.

The control part MCU controls the high-voltage power VCC and ground power GND applied to the power supply part PMIC by simultaneously turning on or off the first switch MT1 and the second switch MT2. The control part MCU can generate such a driving waveform (e.g., a carrier waveform) as shown in FIG. 14 by turning on and off the first switch MT1 and the second switch MT2 at certain intervals, or generate such a driving waveform as shown in FIG. 17 by keeping the first switch MT1 and the second switch MT2 turned on. When the first switch MT1 and the second switch MT2 are off, the data driver 12, gate driver 14, and driving voltage supply part 30 can be in floating state. The control part MCU can generate a control pulse CPLS of a first amplitude W1 with the same phase as the touch driving signal Tdrv and supply it to the modulated ground signal generator 20.

The modulated ground signal generator 20 can generate a modulated ground signal MGND of a second amplitude W2, which is the same amplitude as the touch driving signal Tdrv, by shifting the level of the control pulse CPLS of the first amplitude W1.

The modulated ground signal generator 20 can apply the modulated ground signal MGND to the data driver 12, gate driver 14, and driving voltage supply part 30 while the first switch MT1 and the second switch MT2 are off.

Also, the modulated ground signal generator 20 can apply the modulated ground signal MGND to the data driver 12, gate driver 14, and driving voltage supply part 30 while the first switch MT1 and the second switch MT2 are on. In this instance, the data driver 12 can comprise an adder at its output to produce a modulated source signal Sdrv, and the gate driver 14 can comprise an adder at its output to produce a modulated gate signal Gdrv. Also, the driving voltage supply part 30 can comprise an adder at its output to produce driving voltages EVDD and EVSS. For example, the GND voltage can be modulated with a repeating signal to create the modulated ground signal MGND, which can be further modulated with a gate signal, a touch signal, a display data signal, EVDD or EVSS. In other words, all the signals (e.g., gate signals, display data signals, touch signals) and voltages (e.g., EVDD and EVSS) in the display can use the same carrier signal based on modulated gate signal Gdrv.

Figure 8:
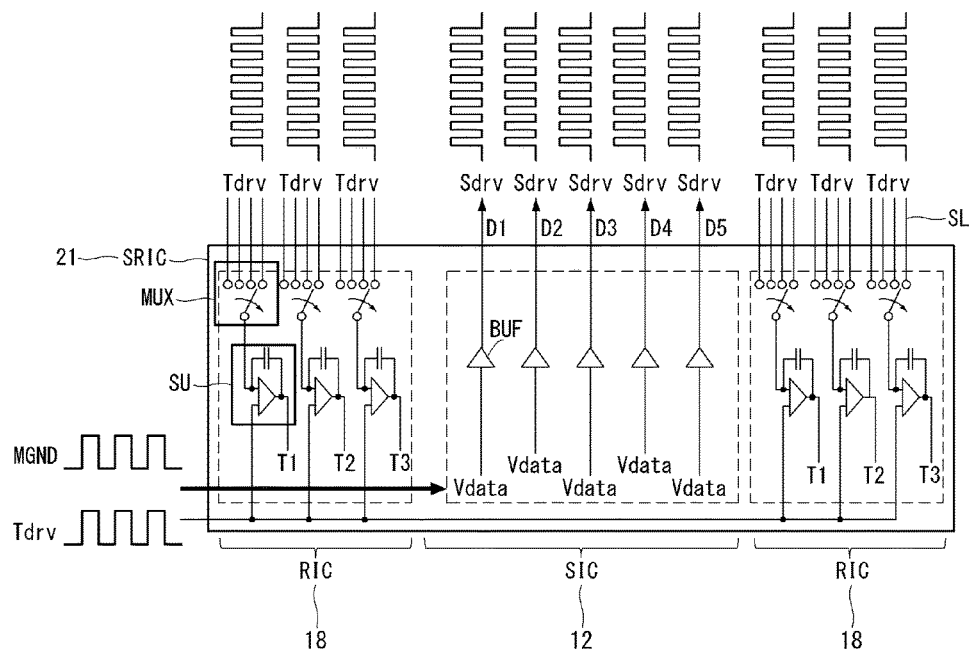
FIG. 8 shows the configuration of a source & readout IC in which a data driver and touch sensor driver are integrated according to an embodiment of the present invention.
Figure 9:
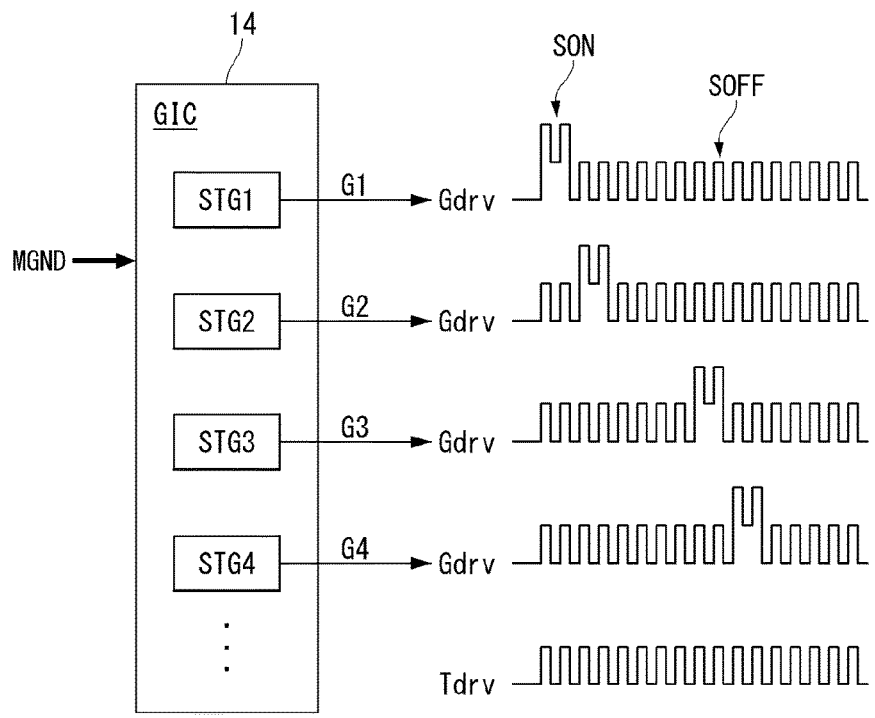
FIG. 9 shows the configuration of a gate driver according to an embodiment of the present invention.

FIG. 8 shows the configuration of a source & readout IC in which the data driver 12 and touch sensor driver 18 are integrated according to an embodiment of the present invention. FIG. 9 shows the configuration of the gate driver 14 according to an embodiment of the present invention.

Referring to FIG. 8, the source & readout IC SRIC 21 comprises a source driver IC SIC for driving the data lines D1 to D5 on the display panel 10 and a readout IC RIC for driving the touch wires SL connected to the touch sensors on the display panel 10.

The source driver IC SIC comprises a digital-to-analog converter for generating a data voltage (source signal) and an output buffer for stabilizing the data voltage, and supplies a modulated source signal Sdrv synchronized with a touch driving signal Tdrv to data lines D1 to D5 according to a modulated ground signal MGND. For example, the modulated source signal Sdrv for writing display data and the touch driving signal Tdrv for sensing touch can both use the same carrier signal, which is based on the modulated ground signal MGND.

The readout IC RIC can comprise a multiplexer MUX and a sensing part SU. The multiplexer MUX supplies a touch driving signal Tdrv to touch sensors TS on all touch block groups, and the sensing part SU selectively senses the touch block groups to which the modulated source signal Sdrv is not written and generates touch sensing signals T1 to T3. The multiplexer MUX supplies the touch driving signal to all the touch block groups, rather than selectively to the touch block groups on which touch sensing occurs, in order to eliminate load variations between the touch sensors TS.

Referring to FIG. 9, a GIP element GIC for implementing the gate driver 14 comprises a plurality of stages STG1 to STG4 connected to gate lines G1 to G4. The GIP element GIC supplies a modulated gate signal Gdrv synchronized with a touch driving signal Tdrv to gate lines G1 to G4 according to a modulated ground signal MGND. A modulated scan-on signal SON that makes up the modulated gate signal Gdrv is a signal obtained by modulating a scan-on gate signal of gate high-voltage level onto the modulated ground signal MGND (e.g., the amplitude of ground signal MGND can be further varied according to a gate scan signal). A modulated source signal Sdrv stored in the data lines is written to the pixels PXL, in synchronization with the modulated scan-on signal SON for displaying image data. A modulated scan-off signal SOFF that makes up the modulated gate signal Gdrv is a signal obtained by modulating a scan-off gate signal of gate low-voltage level on the modulated ground signal MGND. The modulated source signal Sdrv stored in the data lines is kept from being written to the pixels PXL while the modulated scan-off signal SOFF is being applied.

Figure 10:
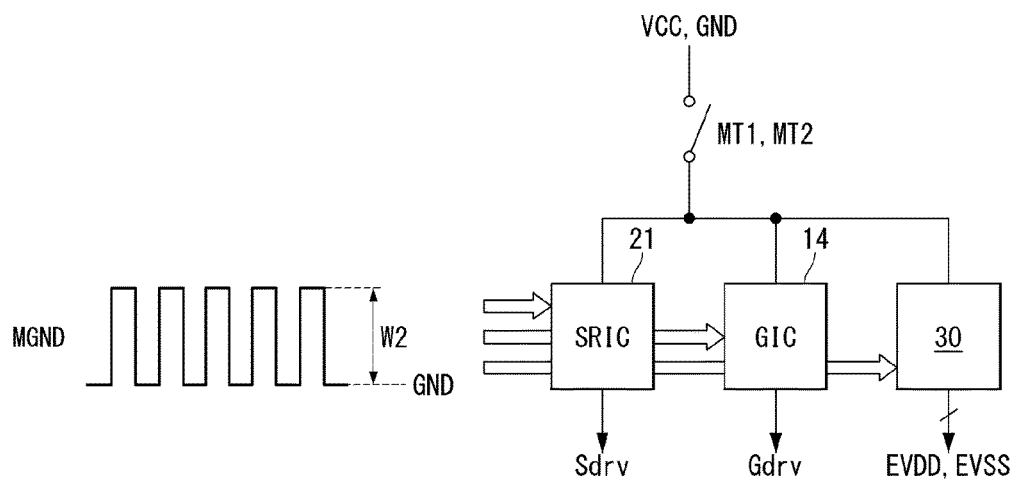
FIG. 10 shows one method in which a modulated source signal and a modulated gate signal are generated using a modulated ground signal according to an embodiment of the present invention.
Figure 11:
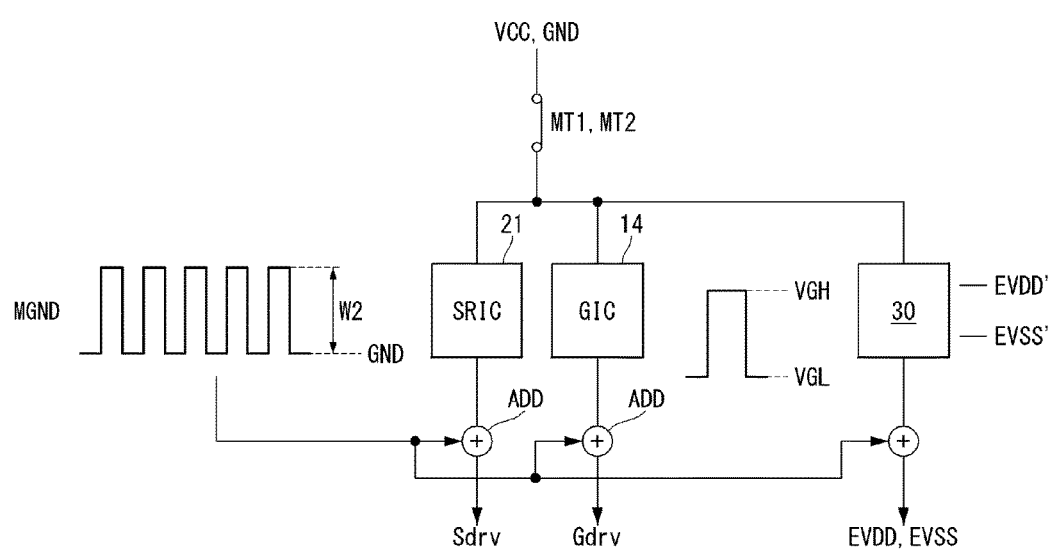
FIG. 11 shows a method in which a modulated source signal and a modulated gate signal are generated using a modulated ground signal according to an embodiment of the present invention.

FIGS. 10 and 11 show methods in which a modulated source signal Sdrv and a modulated gate signal Gdrv are generated using a modulated ground signal MGND according to an embodiment of the present invention.

Referring to FIG. 7 and FIG. 10, the modulated ground signal generator 20 can apply a modulated ground signal MGND to the data driver 12, gate driver 14, and driving voltage supply part 30 only while the first switch MT1 and the second switch MT2 are off.

Since the data driver 12 is in floating state while the first switch MT1 and the second switch MT2 are off, a source signal from the data driver 12 is turned into a modulated source signal Sdrv due to the effect of the modulated ground signal MGND, and the modulated source signal Sdrv has the same phase and amplitude as the modulated ground signal MGND. Since the modulated ground signal MGND has the same phase and the same amplitude as the touch driving signal Tdrv, the modulated source signal Sdrv has the same phase and amplitude as the touch driving signal Tdrv. This minimizes parasitic capacitance between the touch sensors TS and the data lines D1 to Dm, thereby reducing display noise mixed in with a touch sensing signal.

Likewise, since the gate driver 14 is in floating state while the first switch MT1 and the second switch MT2 are off, a gate pulse from the gate driver 14 is turned into a modulated gate signal Gdrv due to the effect of the modulated ground signal MGND, and a modulated scan-on signal and a modulated scan-off signal have the same phase and amplitude as the modulated ground signal MGND. Since the modulated ground signal MGND has the same phase and amplitude as the touch driving signal Tdrv, the modulated gate signal Gdrv has the same phase and amplitude as the touch driving signal Tdrv. This minimizes parasitic capacitance between the touch sensors TS and the gate lines G1 to Gn, thereby reducing display noise mixed in with a touch sensing signal.

Likewise, since the driving voltage supply part 30 is in floating state while the first switch MT1 and the second switch MT2 are off, a high-level driving voltage EVDD and low-level driving voltage EVSS generated by the driving voltage supply part 30 have the same phase and amplitude as the modulated ground signal MGND. Since the modulated ground signal MGND has the same phase and amplitude as the touch driving signal Tdrv, the high-level driving voltage EVDD and the low-level driving voltage EVSS have the same phase and amplitude as the touch driving signal Tdrv. This minimizes parasitic capacitance between the touch sensors TS and the driving voltage supply lines, thereby reducing display noise mixed in with a touch sensing signal. As such, the high-level driving voltage EVDD is a voltage obtained by modulating a high-voltage power signal according to the modulated ground signal MGND, and the low-level driving voltage EVSS is a voltage obtained by modulating a low-voltage power signal according to the modulated ground signal MGND.

Referring to FIGS. 7 and 11, the modulated ground signal generator 20 can apply the modulated ground signal MGND to the data driver 12, gate driver 14, and driving voltage supply part 30 while the first switch MT1 and the second switch MT2 are on.

In this instance, the data driver 12 can comprise an adder at its output to produce a modulated source signal Sdrv. The adder in the data driver 12 adds a source signal and the modulated ground signal MGND to produce a modulated source signal Sdrv, and the modulated source signal Sdrv has the same phase and amplitude as the modulated ground signal MGND. Since the modulated ground signal MGND has the same phase and amplitude as the touch synchronization signal Tdrv, the modulated source signal Sdrv has the same phase and amplitude as the touch synchronization signal Tdrv. This minimizes parasitic capacitance between the touch sensors TS and the gate lines G1 to Gn, thereby reducing display noise mixed in with a touch sensing signal.

The gate driver 14 can comprise an adder at its output to produce a modulated gate signal Gdrv. The adder in the gate driver 14 adds a gate pulse and the modulated ground signal MGND to produce a modulated gate signal Gdrv. That is, the adder in the gate driver 14 produces a modulated scan-on signal SON by adding a scan-on gate signal VGH and the modulated ground signal MGND, and also produces a modulated scan-off signal SOFF by adding a scan-off gate signal VGL and the modulated ground signal MGND. The modulated gate signal Gdrv has the same phase and amplitude as the modulated ground signal MGND. Since the modulated ground signal MGND has the same phase and amplitude as the touch driving signal Tdrv, the modulated gate signal Gdrv has the same phase and amplitude as the touch driving signal Tdrv. This minimizes parasitic capacitance between the touch sensors TS and the gate lines G1 to Gn, thereby reducing display noise mixed in with a touch sensing signal.

Figure 12:
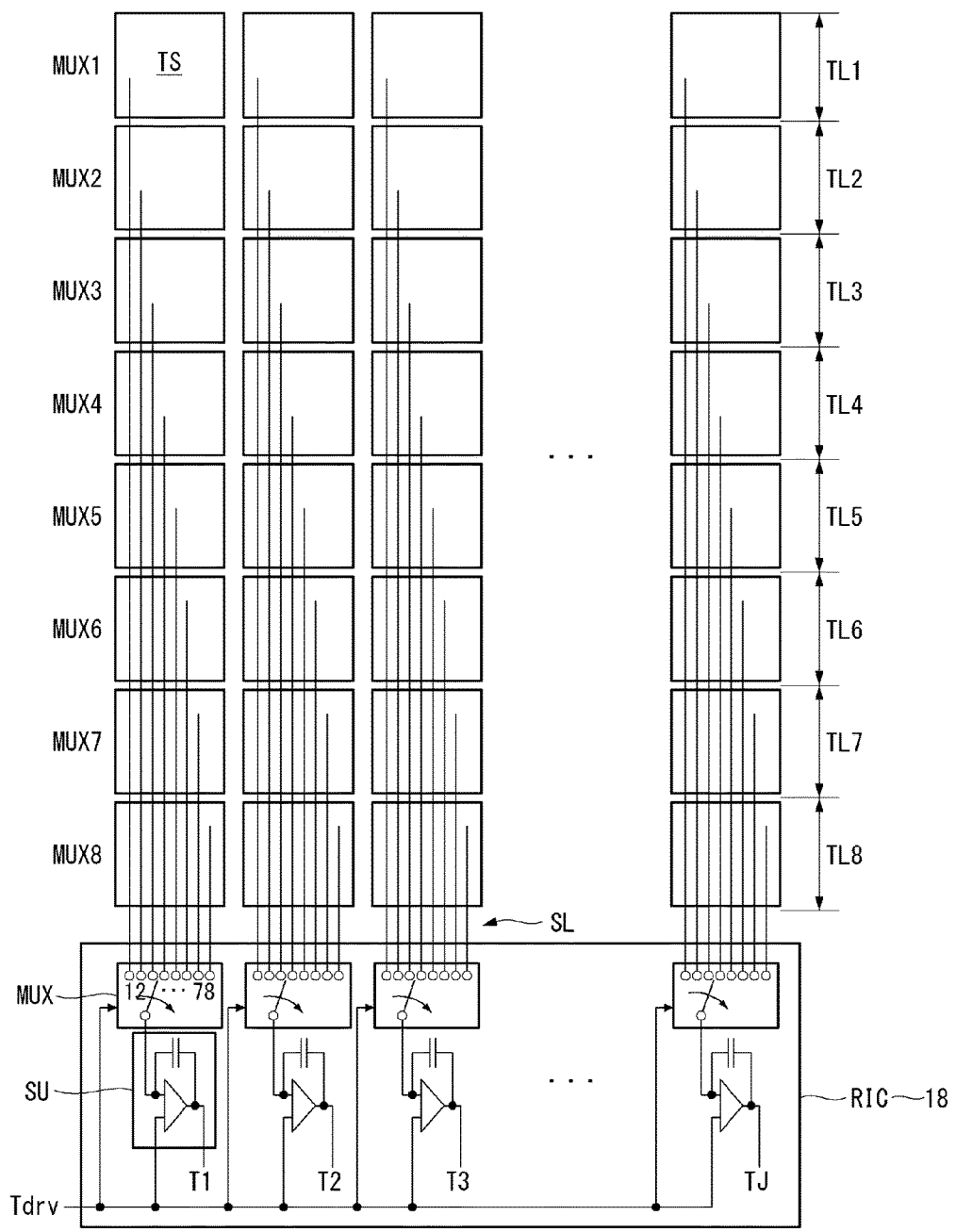
FIG. 12 shows some of the touch sensors embedded in a pixel array and the configuration of a readout IC for driving them according to an embodiment of the present invention.

Also, the driving voltage supply part 30 can comprise an adder at its output to produce driving voltages EVDD and EVSS. The adder in the driving voltage supply part 30 produces a high-level driving voltage EVDD of AC level by adding a high-level driving signal EVDD of DC level and the modulated ground signal MGND, and also produces a low-level driving voltage EVSS of AC level by adding a low-level driving signal EVSS of DC level and the modulated ground signal MGND. The driving voltages EVDD and EVSS have the same phase and amplitude as the modulated ground signal MGND. Since the modulated ground signal MGND has the same phase and amplitude as the touch driving signal Tdrv, the driving voltages EVDD and EVSS have the same phase and amplitude as the touch driving signal Tdrv. This minimizes parasitic capacitance between the touch sensors TS and the driving voltage supply lines, thereby reducing display noise mixed in with a touch sensing signal. FIG. 12 shows some of the touch sensors embedded in the pixel array and the configuration of a readout IC for driving them.

Referring to FIG. 12, when the resolution of the touch sensors TS is J (horizontal)×K (vertical) (where J and K are positive integers equal to or greater than 2), the required number of multiplexers MUX can be J. Each multiplexer MUX is connected to K touch sensors TS through K touch wires SL, and the K touch wires SL are sequentially connected to one sensing unit SU. In this instance, a touch driving signal Tdrv is supplied simultaneously to all touch sensors TS on all touch block groups TL1 to TL8.

For example, each multiplexer MUX can selectively connect eight MUX channels CH1 to CH8, which are respectively connected to eight touch wires SL, to one sensing unit SU. When each of the J multiplexers connects the first MUX channel CH1 to the respective sensing units SU, these sensing units SU convert the amount of electric charge received from the touch sensors TS on a first touch block group TL1 into digital data T1 to TJ. When the each of J multiplexers connects the second MUX channel CH2 to the respective sensing units SU, these sensing units SU convert the amount of electric charge received from the touch sensors TS on a second touch block group TL2 into digital data T1 to TJ. In the same manner, when the each of the J multiplexers connects the eighth MUX channel CH8 to the respective sensing units SU, these sensing units SU convert the amount of electric charge received from the touch sensors TS on an eighth touch block group TL8 into digital data T1 to TJ.

In other words, touch sensing on the first touch block group TL1 occurs when the first MUX channel CH1 for each of the multiplexers MUX is connected to (switched to) the corresponding sensing unit SU, touch sensing on the second touch block group TL2 occurs when the second MUX channel CH2 for the multiplexers MUX is connected to the corresponding sensing unit SU, and touch sensing on the eighth touch block group TL8 occurs when the eighth MUX channel CH8 for the multiplexers MUX is connected to the corresponding sensing unit SU.

Each sensing unit SU can comprise an amplifier for amplifying a received voltage from the touch sensors TS, an integrator for accumulating the output voltage of the amplifier, and an analog-to-digital converter (hereinafter, "ADC") for converting the output voltage of the integrator to digital data. The digital data T1 to TJ output from the ADC is touch raw data, and this touch raw data is transmitted to a touch controller.

Figure 13:
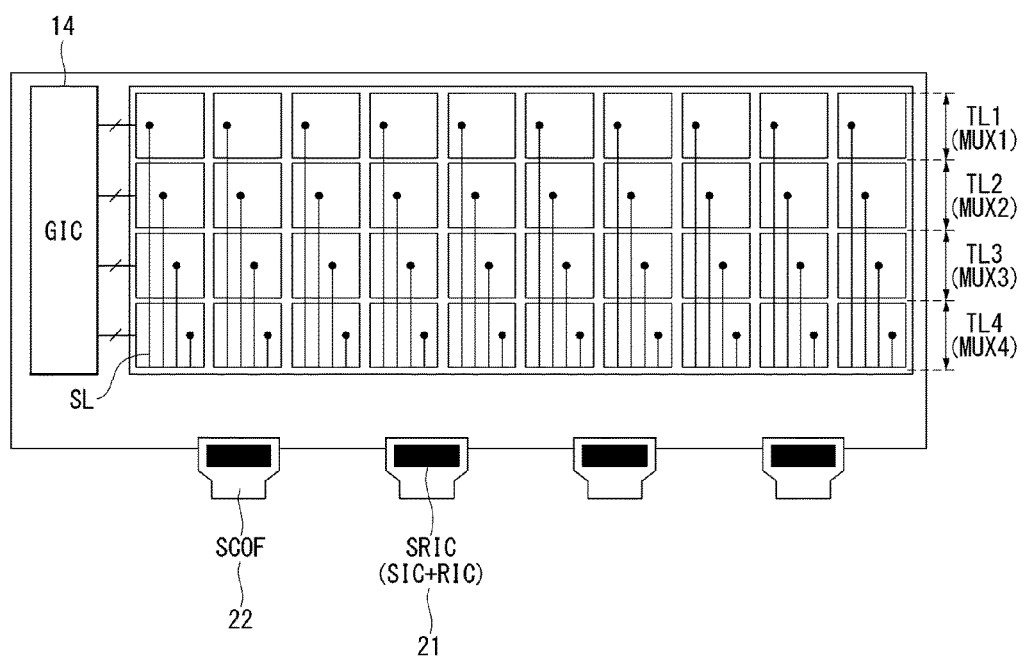
FIG. 13 is a view showing a pixel array consisting of first to fourth touch block groups and drivers for driving it according to an embodiment of the present invention.
Figure 15:
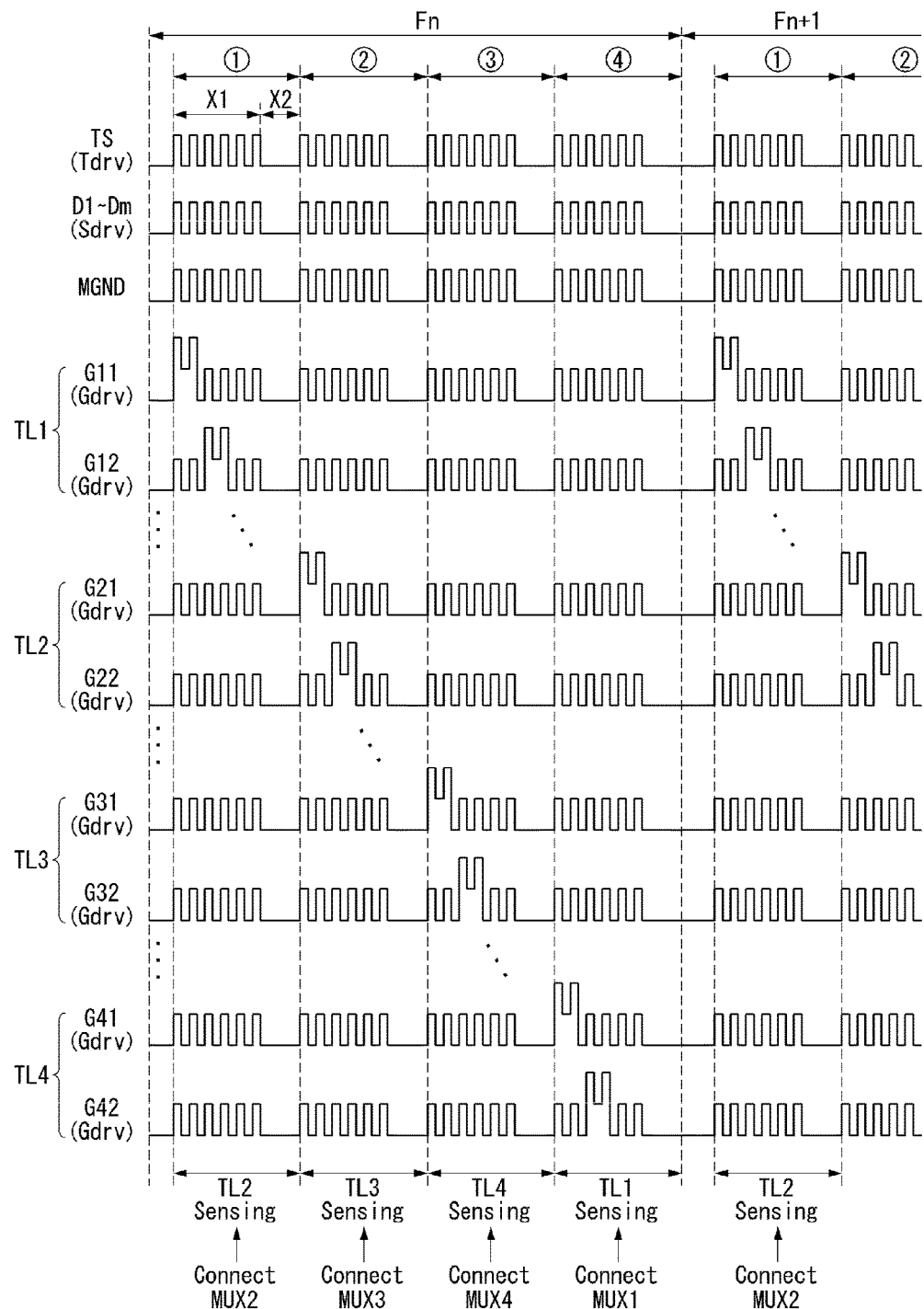
FIGS. 15 and 16 are views showing examples in which a touch block group, to which a modulated source signal is written for writing display data, and a touch block group, on which touch sensing occurs at the same time the display is being written, are spatially separated from each other at regions of the display according to the driving signals of FIG. 14.
Figure 16:
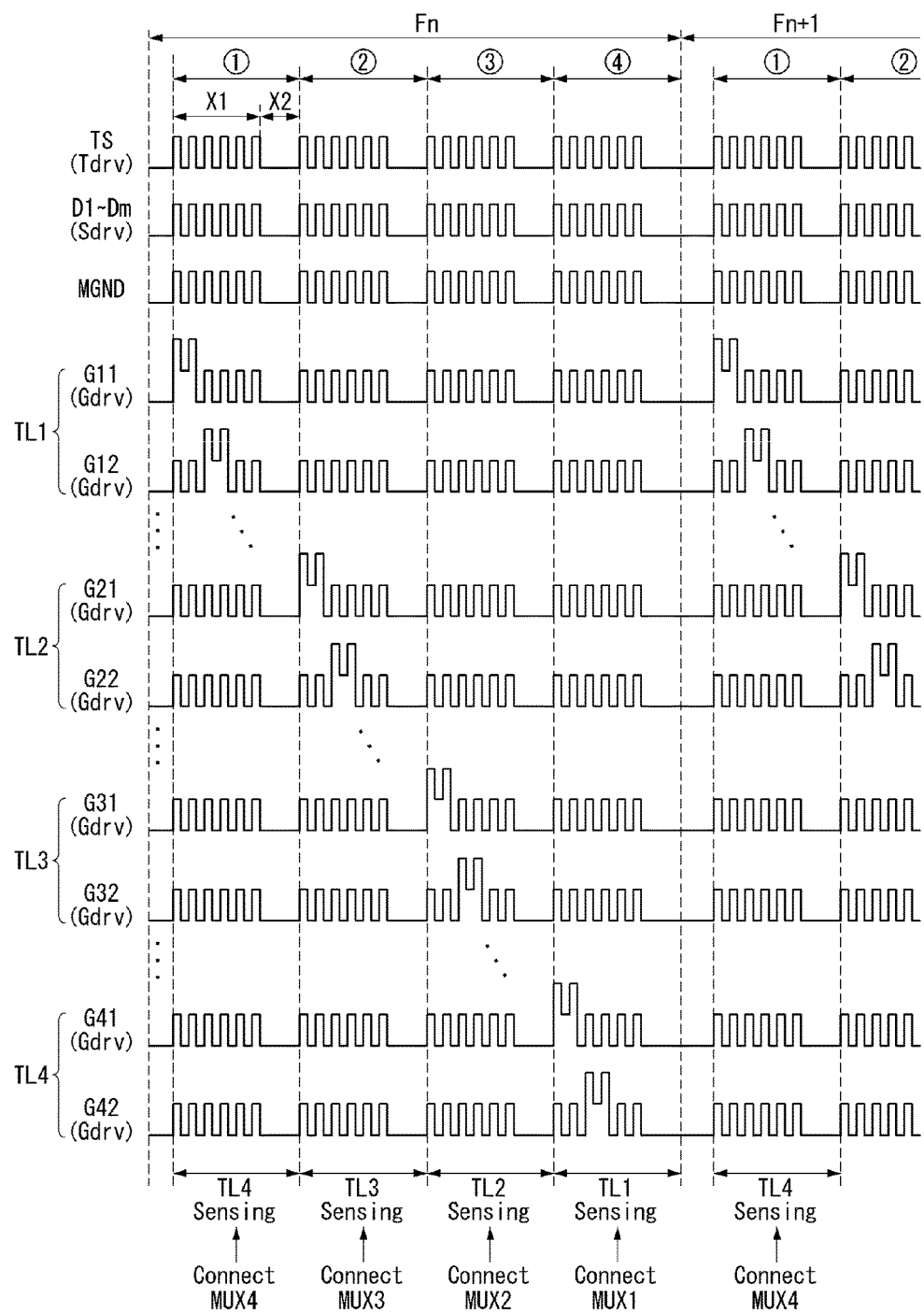

FIG. 13 shows a pixel array consisting of first to fourth touch block groups TL1 to TL4 and drivers for driving it. FIG. 14 shows an example of driving signals for driving a display device. FIGS. 15 and 16 show examples in which a touch block group to which a modulated source signal is written for writing image data and a touch block group on which touch sensing occurs are spatially separated from each other according to the driving signals of FIG. 14. In other words, the display writes display image data and senses touch at the same time, but at different locations on the display.

Referring to FIGS. 13 and 14, the touch sensor driver 18 applies a touch driving signal Tdrv to touch wires SL connected to touch sensors TS on all touch block groups TL1 to TL4, and selectively senses the other touch block groups except for the touch block group that receives a modulated scan-on signal SON. In FIG. 14, X1 denotes a period of time when high-voltage power VCC and ground power GND are cut off from the data driver 12 and the gate driver 14 and a modulated ground signal MGND is applied to them, and X2 denotes a period of time when the high-voltage power VCC and the ground power GND are applied to the data driver 12 and the gate driver 14.

In the period ① of an nth frame Fn, when a modulated scan-on signal (SON of Gdrv) is sequentially supplied to gate lines G11, G12, . . . of the first touch block group TL1 and a modulated source signal Sdrv is written to the pixels on the first touch block group TL1 for writing display image data, the touch sensor driver 18 can perform touch sensing on TLa. Here, TLa can include at least one of the other touch block groups TL2, TL3, and TL4, except for the first touch block group TL1.

In the period ② of the nth frame Fn, when the modulated scan-on signal (SON of Gdrv) is sequentially supplied to gate lines G21, G22, . . . of the second touch block group TL2 and the modulated source signal Sdrv is written to the pixels on the second touch block group TL2, the touch sensor driver 18 can perform touch sensing on TLb. Here, TLb can include at least one of the other touch block groups TL1, TL3, and TL4, except for the second touch block group TL2 whose corresponding pixels are being written with display data.

In the period ③ of the nth frame Fn, when the modulated scan-on signal (SON of Gdrv) is sequentially supplied to gate lines G31, G32, . . . of the third touch block group TL3 and the modulated source signal Sdrv is written to the pixels on the third touch block group TL3, the touch sensor driver 18 can perform touch sensing on TLc. Here, TLc can include at least one of the other touch block groups TL1, TL2, and TL4, but not the third touch block group TL3.

In the period ④ of the nth frame Fn, when the modulated scan-on signal (SON of Gdrv) is sequentially supplied to gate lines G41, G42, . . . of the fourth touch block group TL4 and the modulated source signal Sdrv is written to the pixels on the fourth touch block group TL4, the touch sensor driver 18 can perform touch sensing on TLd. Here, TLd can include at least one of the other touch block groups TL1, TL2, and TL3, except for the fourth touch block group TL4.

In addition, as shown in FIG. 15, when one touch block group, to which the modulated scan-on signal SON is applied, is sequentially selected in a first direction, e.g., from top to bottom, the touch sensor driver 18 can determine which other touch block group to selectively sense in the first direction, among the other touch block groups. Specifically, when the modulated scan-on signal SON is applied to the first touch block group TL1 in the period ① of the nth frame Fn, the touch sensor driver 18 can perform touch sensing on the second touch block group TL2. When the modulated scan-on signal SON is applied to the second touch block group TL2 in the period ② of the nth frame Fn, the touch sensor driver 18 can perform touch sensing on the third touch block group TL3. When the modulated scan-on signal SON is applied to the third touch block group TL3 in the period ③ of the nth frame Fn, the touch sensor driver 18 can perform touch sensing on the fourth touch block group TL4. When the modulated scan-on signal SON is applied to the fourth touch block group TL4 in the period ④ of the nth frame Fn, the touch sensor driver 18 can perform touch sensing on the first touch block group TL1.

Furthermore, as shown in FIG. 16, when one touch block group, to which the modulated scan-on signal SON is applied, is sequentially selected in a first direction, e.g., from top to bottom, the touch sensor driver 18 can determine which touch block group to selectively sense in a second direction (e.g., from bottom to top) opposite to the first direction, among the other touch block groups. Specifically, when the modulated scan-on signal SON is applied to the first touch block group TL1 in the period ① of the nth frame Fn, the touch sensor driver 18 can perform touch sensing on the fourth touch block group TL4. When the modulated scan-on signal SON is applied to the second touch block group TL2 in the period ② of the nth frame Fn, the touch sensor driver 18 can perform touch sensing on the third touch block group TL3. When the modulated scan-on signal SON is applied to the third touch block group TL3 in the period ③ of the nth frame Fn, the touch sensor driver 18 can perform touch sensing on the second touch block group TL2. When the modulated scan-on signal SON is applied to the fourth touch block group TL4 in the period ④ of the nth frame Fn, the touch sensor driver 18 can perform touch sensing on the first touch block group TL1.

In addition, when one touch block group, to which the modulated scan-on signal SON is applied, is sequentially selected in a first direction, e.g., from top to bottom, the touch sensor driver 18 can randomly determine another touch block group to selectively sense regardless of the first direction, among the other touch block groups (e.g., any touch block group can be random selected for touch sensing, except for the touch block group that is currently being written with display data).

Furthermore, the touch sensor driver 18 can improve sensing accuracy by simultaneously sensing a plurality of touch block groups in each of the periods ① to ④, among the other touch block groups to which the modulated scan-on signal SON is not applied (e.g., touch sensing can be performed on multiple touch block groups at the same time, except for the touch block group that is currently being written with display data).

Figure 18:
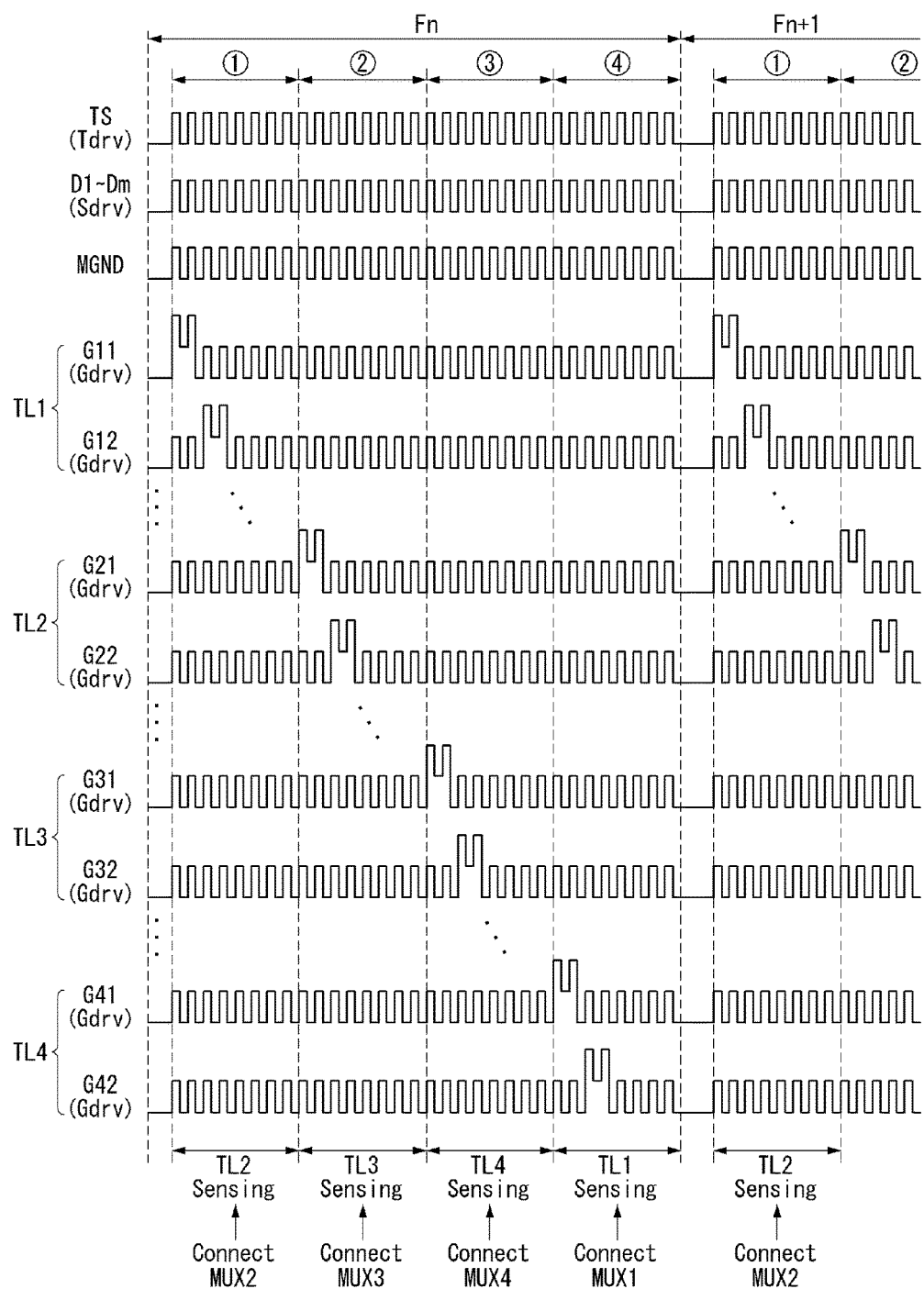
FIGS. 18 and 19 are views showing examples in which a touch block group, to which a modulated source signal is written for writing display data, and a touch block group, on which touch sensing occurs, are spatially separated from each other at different locations according to the driving signals of FIG. 17.
Figure 19:
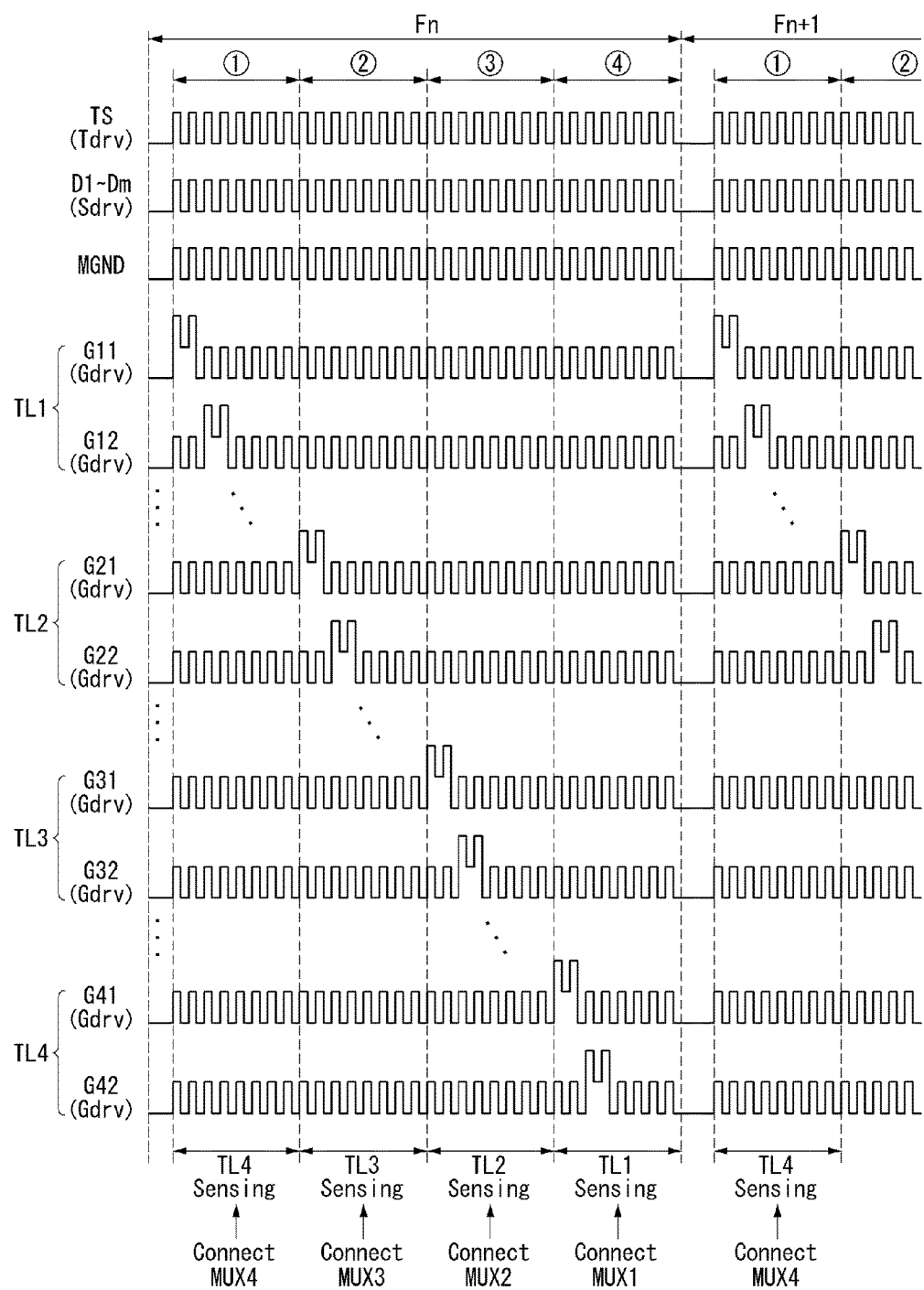

FIG. 17 shows another example of driving signals for driving a display device. FIGS. 18 and 19 show examples in which a touch block group to which a modulated source signal is written for writing image display data to a portion of the display and a touch block group on which touch sensing occurs, which are spatially separated from each other according to the driving signals of FIG. 17. In other words, the display writes display image data and senses touch at the same time, but at different locations.

FIGS. 17 to 19 are different from FIGS. 14 to 16 in that the modulated ground signal MGND is applied during the frames Fn and Fn+1 while the high-voltage power VCC and the ground power GND are continuously being applied. The touch sensing concept of FIGS. 17 to 19 is substantially the same as explained with reference to FIGS. 14 to 16.

Figure 20:
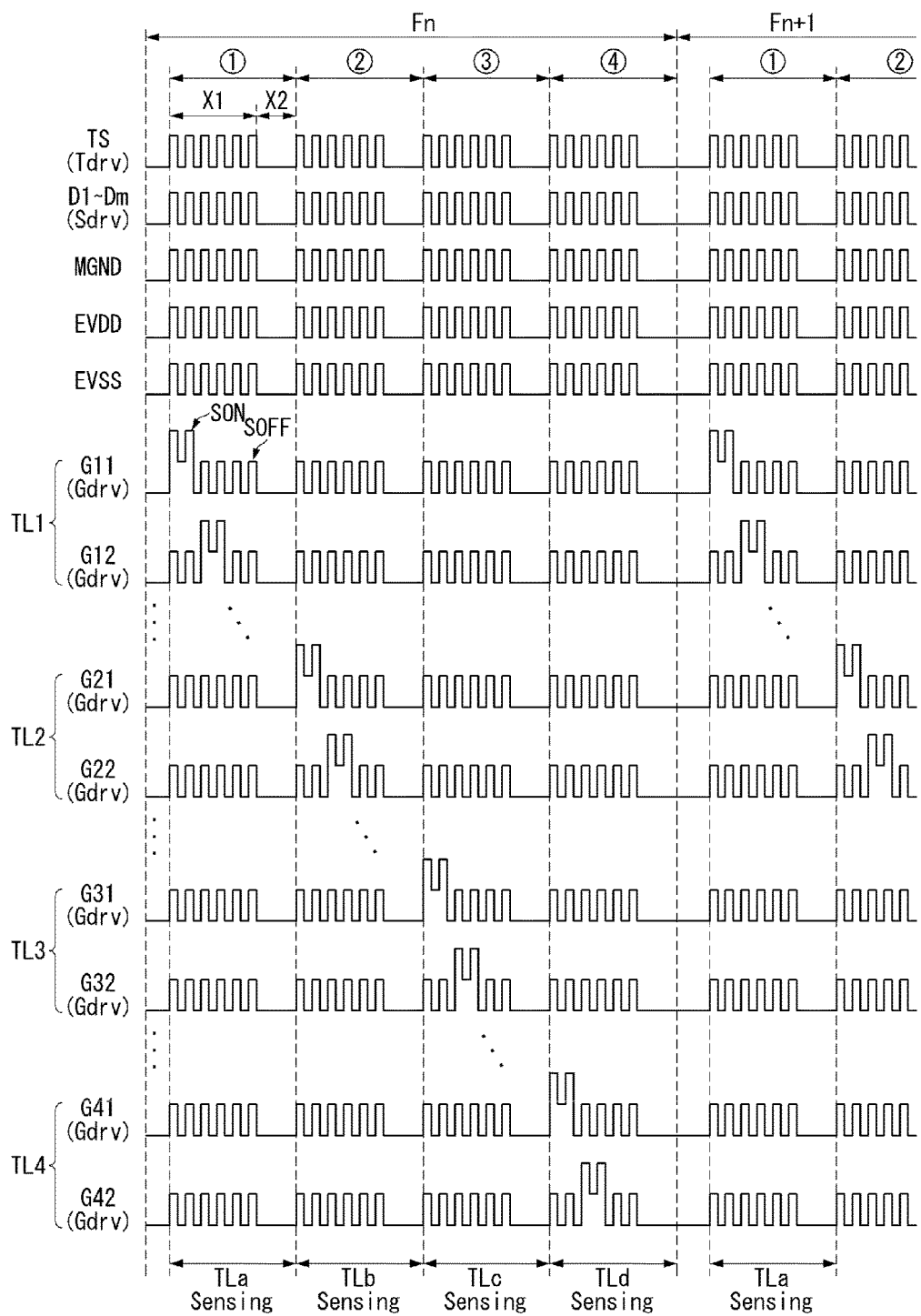
FIGS. 20 and 21 are views showing yet another example of driving signals for driving a display device according to an embodiment of the present invention.
Figure 21:
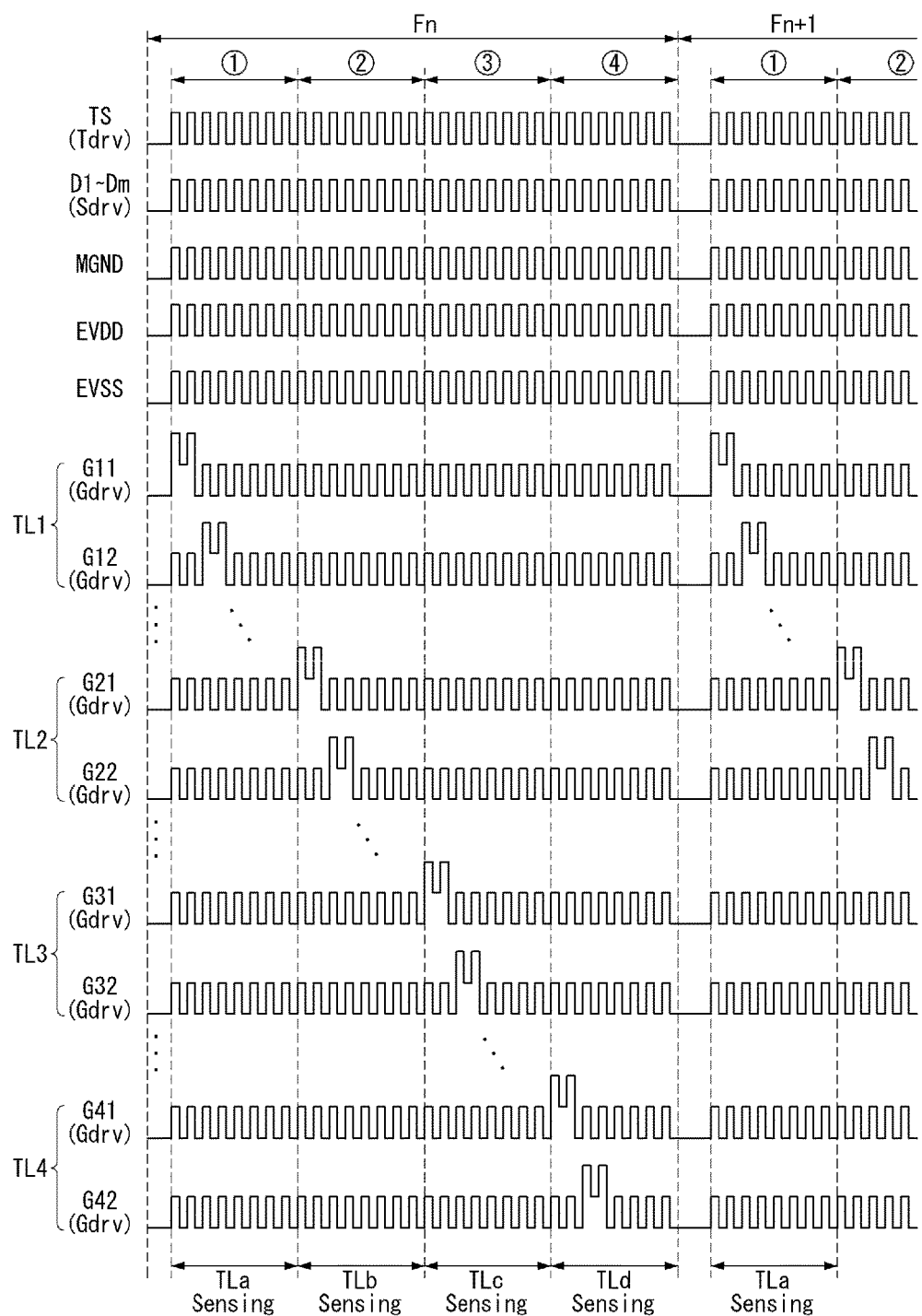

FIGS. 20 and 21 show yet another example of driving signals for driving a display device. FIGS. 20 and 21 can apply when the display device is implemented as an organic light-emitting diode display.

As compared to FIG. 14, the configurations and operational effects presented in FIG. 20 are substantially the same as explained with reference to FIGS. 14 to 16, except that the high-level driving voltage EVDD and low-level driving voltage EVSS applied to the pixels also have the same phase and the same amplitude as the touch driving signal Tdrv. In other words, the high-level driving voltage EVDD, the low-level driving voltage EVSS, the touch driving signal Tdrv, the modulated source signal Sdrv and the modulated ground signal MGND are all synchronized.

As compared to FIG. 17, the configurations and operational effects presented in FIG. 21 are substantially the same as explained with reference to FIGS. 17 to 19, except that the high-level driving voltage EVDD and low-level driving voltage EVSS applied to the pixels also have the same phase and the same amplitude as the touch driving signal Tdrv. As discussed above, the present invention can solve the lack of touch sensing time and display charging time, which occurs in the time-division driving technology of the related art, by making a display interval for display writing and a touch interval for touch sensing that temporally overlap within the same frame, rather than temporally separating them from each other. As a consequence, the present invention can enhance the picture quality of display images and touch sensitivity.

In addition to providing a display interval for display writing and a touch interval for touch sensing that overlap during a same period within the same frame, a display write position and a touch sensing position can be spatially separated from each other within the display panel (e.g., image writing and touch sensing operations can be performed at the same time, but at different locations on the display), and while notably, a modulated source signal and a modulated gate signal both synchronized with a touch driving signal and high-level and low-level driving voltages can be supplied to data lines, gate lines, and driving voltage supply lines, respectively. Therefore, the present invention can significantly reduce the attenuation of a touch sensing signal, caused by parasitic capacitance formed by signal lines for display and touch sensors, thus improving touch sensing accuracy.

Throughout the description, it should be understood by those skilled in the art that various changes and modifications are possible without departing from the technical principles of the present invention. Therefore, the technical scope of the present invention is not limited to the detailed descriptions in this specification but should be defined by the scope of the appended claims.

What is claimed is:

1. A display device having touch sensors, the display device comprising:
   a display panel comprising a plurality of touch block groups, each touch block group among the plurality of touch block groups including a plurality of touch sensors, each touch sensor among the plurality of touch sensors corresponding to one or more pixels among a plurality of pixels defined by data lines and gate lines;
   a data driver configured to generate a modulated source signal for displaying data and supplying the modulated source signal to a data line among the data lines;
   a gate driver configured to generate a modulated scan-on signal for writing the modulated source signal to a pixel among the plurality of pixels and a modulated scan-off signal for preventing the modulated source signal from being written to a corresponding pixel among the plurality of pixels, and supply the modulated scan-on signal and the modulated scan-off signal to the gate lines; and
   a touch sensor driver configured to:
      supply a touch driving signal to touch wires respectively connected to corresponding touch sensors in each of the plurality of touch block groups, and
      selectively sense touch on at least one touch block group among the plurality of touch block groups, except for a restricted touch block group among the plurality of touch block groups,
   wherein the restricted touch block group is a touch block group that overlaps with at least one gate line that is currently being supplied with the modulated scan-on signal, and
   wherein the modulated source signal or the modulated scan-off signal is synchronized with the touch driving signal,
   wherein display frames of the display device include a plurality of periods, the plurality of periods having a first section and a second section,
   wherein the data driver supplies the modulated source signal to the data line among the data lines during the first section but does not supply the modulated source signal to the data line among the data lines during the second section,
   wherein the gate driver supplies the modulated scan-on signal and the modulated scan-off signal to the gate lines during the first section but does not supply the modulated scan-on signal and the modulated scan-off signal to the gate lines during the second section,
   wherein the modulated scan-off signal swings between a first voltage level and a second voltage level, respectively, and the modulated scan-on signal swings between a third voltage level and a fourth voltage level, and
   wherein the second voltage level is higher than the first voltage level and lower than the third voltage level and the fourth voltage level.

2. The display device of claim 1, wherein the gate driver supplies the modulated scan-off signal to other touch block groups among the plurality of touch block groups other than the restricted touch block group.

3. The display device of claim 2, wherein the modulated source signal, the modulated scan-on signal, and the modulated scan-off signal have a same phase as the touch driving signal.

4. The display device of claim 1, further comprising a driving voltage supply part configured to generate a high-level driving voltage and a low-level driving voltage for driving the plurality of pixels, and supply the high-level driving voltage to a first driving voltage supply line and the low-level driving voltage to a second driving voltage supply line,
   wherein the high-level driving voltage and the low-level driving voltage have a same phase as the touch driving signal.

5. The display device of claim 4, wherein the modulated source signal, the modulated scan-on signal, the modulated scan-off signal, the high-level driving voltage, and the low-level driving voltage are generated based a modulated ground signal having the same phase as the touch driving signal.

6. The display device of claim 5, wherein the modulated source signal is a signal generated by modulating a data voltage based on the modulated ground signal,
wherein the modulated scan-on signal is generated by modulating a scan-on gate signal of a gate high-voltage level based on the modulated ground signal,
wherein the modulated scan-off signal is generated by modulating a scan-off gate signal of a gate low-voltage level based on the modulated ground signal,
wherein the high-level driving voltage is generated by modulating a high-voltage power signal based on the modulated ground signal, and
wherein the low-level driving voltage is generated by modulating a low-voltage power signal based on the modulated ground signal.

7. The display device of claim 1, wherein the gate driver sequentially supplies the modulated scan-on signal to the gate lines corresponding to the plurality of touch block groups in a first direction, and the touch sensor driver selectively senses for touch on another touch block group among the plurality of touch block groups in the first direction or a second direction opposite to the first direction, and
wherein the another touch block line is a different touch block line than the restricted touch block group.

8. The display device of claim 1, wherein the gate driver sequentially supplies the modulated scan-on signal to the gate lines corresponding to the plurality of touch block groups in a first direction, and the touch sensor driver randomly senses for touch on another touch block group among the plurality of touch block groups, and
wherein the another touch block group is a different touch block group than the restricted touch block group.

9. The display device of claim 1, further comprising:
a power supply part connected to a high-voltage power source through a first switch and a ground power source through a second switch, and configured to supply high-voltage power and ground power to the data driver, the gate driver, and a driving voltage supply part configured to generate a high-level driving voltage and a low-level driving voltage for driving the plurality of pixels;
a control part configured to turn on or off the first switch and the second switch and repetitively supply the high-voltage power and the ground power to the power supply part; and
a modulated ground signal generator configured to generate a modulated ground signal and supply the modulated ground signal to the data driver, the gate driver, and the driving voltage supply part,
wherein the modulated source signal, the modulated scan-on signal, the high-level driving voltage and the low-level driving voltage are generated based on the modulated ground signal.

10. The display device of claim 9, wherein the modulated ground signal supplied by the modulated ground signal generator to the data driver, the gate driver, and the driving voltage supply part is not continuously supplied during a frame period.

11. The display device of claim 9,
wherein the data driver includes an adder configured to output the modulated source signal by adding a source signal and the modulated ground signal,
wherein the gate driver includes an adder configured to output the modulated scan-on signal by adding a scan-on gate signal and the modulated ground signal and output the modulated scan-off signal by adding a scan-off gate signal and the modulated ground signal, and
wherein the driving voltage supply part includes an adder configured to output the high-level driving voltage by adding a high-level driving signal having a direct current (DC) voltage level and the modulated ground signal and output the low-level driving voltage by adding a low-level driving signal having a DC voltage level and the modulated ground signal.

12. The display device of claim 1, wherein a touch sensor driver supplies the touch driving signal to the touch sensors in all of the plurality of touch block groups during the first section.

13. A method of driving a display device having touch sensors, the method comprising:
supplying a modulated source signal for displaying data to a data line;
supplying a modulated scan-on signal to gate lines for writing the modulated source signal to a pixel among a plurality of pixels;
supplying a modulated scan-off signal to the gate lines for preventing the modulated source signal from being written to a corresponding pixel among the plurality of pixels;
supplying a touch driving signal to touch wires respectively connected to corresponding touch sensors in a touch block group among a plurality of touch block groups, wherein each touch block group among the plurality of touch block groups includes a plurality of touch sensors that each correspond to one or more pixels among the plurality of pixels; and
selectively sensing touch on at least one touch block group among the plurality of touch block groups, except for a restricted touch block group among the plurality of touch block groups,
wherein the restricted touch block group is a touch block group that overlaps with at least one gate line that is currently being supplied with the modulated scan-on signal, and
wherein the modulated source signal or the modulated scan-off signal is synchronized with the touch driving signal,
wherein display frames of the display device include a plurality of periods, the plurality of periods having a first section and a second section,
wherein the data driver supplies the modulated source signal to the data line among the data lines during the first section but does not supply the modulated source signal to the data line among the data lines during the second section,
wherein the gate driver supplies the modulated scan-on signal and the modulated scan-off signal to the gate lines during the first section but does not supply the modulated scan-on signal and the modulated scan-off signal to the gate lines during the second section,
wherein the modulated scan-off signal swings between a first voltage level and a second voltage level, respectively, and the modulated scan-on signal swings between a third voltage level and a fourth voltage level, and
wherein the second voltage level is higher than the first voltage level and lower than the third voltage level and the fourth voltage level.

14. The method of claim 13,
wherein the modulated scan-off signal is supplied to other touch block groups among the plurality of touch block lines other than the restricted touch block group that is supplied with the modulated scan-on signal.

15. The method of claim 14, wherein the modulated source signal, the modulated scan-on signal, and the modulated scan-off signal have a same phase as the touch driving signal.

16. The method of claim 13, further comprising:
generating a high-level driving voltage and a low-level driving voltage, by a driving voltage supply part, for driving the plurality of pixels; and
supplying the high-level driving voltage to a first driving voltage supply line and the low-level driving voltage to a second driving voltage supply line,
wherein the high-level driving voltage and the low-level driving voltage have a same phase as the touch driving signal.

17. The method of claim 16, wherein the modulated source signal, the modulated scan-on signal, the modulated scan-off signal, the high-level driving voltage, and the low-level driving voltage are generated based on a modulated ground signal having the same phase as the touch driving signal.

18. The method of claim 17, wherein the modulated source signal is a signal generated by modulating a data voltage based on the modulated ground signal,
wherein the modulated scan-on signal is generated by modulating a scan-on gate signal of a gate high-voltage level based on the modulated ground signal,
wherein the modulated scan-off signal is generated by modulating a scan-off gate signal of a gate low-voltage level based on the modulated ground signal,
wherein the high-level driving voltage is generated by modulating a high-voltage power signal based on the modulated ground signal, and
wherein the low-level driving voltage is generated by modulating a low-voltage power signal based on the modulated ground signal.

19. The method of claim 13, further comprising:
sequentially supplying the modulated scan-on signal to the plurality of touch block groups in a first direction; and
selectively sensing for touch on another touch block group among the plurality of touch block groups in the first direction or a second direction opposite to the first direction,
wherein the another touch block group is a different touch block group than the restricted touch block group.

20. The method of claim 13, further comprising:
sequentially supplying the modulated scan-on signal to the plurality of touch block groups in a first direction; and
randomly selecting another touch block group among the plurality of touch block groups and sensing for touch on the another touch block group,
wherein the another touch block group is a different touch block group than the restricted touch block group.

21. The method of claim 13, wherein the modulated source signal and the modulated scan-on signal are generated based on a modulated ground signal supplied to the data driver and the gate driver, and
wherein the modulated ground signal supplied to the data driver and the gate driver is not continuously supplied during a frame period.

22. The method of claim 13, wherein the touch driving signal is supplied to the touch sensors in all of the plurality of touch block groups during the first section.

* * * * *